United States Patent [19]
Hunter

[11] Patent Number: 6,063,185
[45] Date of Patent: May 16, 2000

[54] PRODUCTION OF BULK SINGLE CRYSTALS OF ALUMINUM NITRIDE, SILICON CARBIDE AND ALUMINUM NITRIDE: SILICON CARBIDE ALLOY

[75] Inventor: Charles Eric Hunter, Hilton Head Island, S.C.

[73] Assignee: Cree, Inc., Durham, N.C.

[21] Appl. No.: 09/169,401

[22] Filed: Oct. 9, 1998

[51] Int. Cl.⁷ ................................................ C30B 23/00
[52] U.S. Cl. .............................. 117/84; 117/88; 117/89; 117/105; 117/951; 117/952
[58] Field of Search ................. 117/84, 88, 89, 117/952, 951, 105

[56] References Cited

U.S. PATENT DOCUMENTS

| | | |
|---|---|---|
| Re. 34,861 | 2/1995 | Davis et al. . |
| 3,121,062 | 2/1964 | Gould . |
| 3,275,415 | 9/1966 | Chang et al. . |
| 3,634,149 | 1/1972 | Knippenberg et al. ................. 148/175 |
| 4,147,572 | 4/1979 | Vodakov et al. . |
| 4,152,182 | 5/1979 | Rutz . |
| 4,382,837 | 5/1983 | Rutz ....................................... 156/610 |
| 4,489,128 | 12/1984 | Rutz . |
| 4,597,949 | 7/1986 | Jasinski et al. . |
| 4,897,149 | 1/1990 | Suzuki et al. ........................... 156/610 |
| 5,034,604 | 7/1991 | Streetman et al. . |
| 5,270,263 | 12/1993 | Kim . |
| 5,272,239 | 12/1993 | Jensen ........................................ 528/9 |
| 5,326,992 | 7/1994 | Yoder ....................................... 257/77 |
| 5,350,699 | 9/1994 | Nii . |
| 5,387,804 | 2/1995 | Suzuki et al. . |
| 5,433,167 | 7/1995 | Furukawa et al. . |
| 5,637,146 | 6/1997 | Chyi . |
| 5,679,965 | 10/1997 | Schetzina . |
| 5,858,086 | 1/1999 | Hunter ...................................... 117/84 |

OTHER PUBLICATIONS

Slack et al. "AIN Single Crystals", Journal of Crystal Growth 42, 'pp. 560–563 (1977
Abernathy et al. Congruent (Diffusionless) Vapor Transport, Journal of Crystal Growth 47, 'pp. 145–154 (1979).
Dryburgh, "The Estimation of Maximum Growth Rate for Aluminum Nitride Crystals Grown by Direct Sublimation", Journal of Crystal Growth 125, pp. 65–68 (1992).
Chow et al. "Wide Bandgap Compound Semiconductors for Superior High–Voltage Unipolar Power Devices" IEEE Transactions on Electron Devices, vol. 42, No. 8 (Aug. 1994.
Slack et al. "Growth of High Purity AIN Crystals" (1976).

*Primary Examiner*—Benjamin L. Utech
*Assistant Examiner*—Matthew Anderson
*Attorney, Agent, or Firm*—Richard S. Faust

[57] ABSTRACT

Low defect density, low impurity bulk single crystals of AlN, SiC and AlN:SiC alloy are produced by depositing appropriate vapor species of Al, Si, N, C on multiple nucleation sites that are preferentially cooled to a temperature less than the surrounding surfaces in the crystal growth enclosure. The vapor species may be provided by subliming solid source material, vaporizing liquid Al, Si or Al—Si or injecting source gases. The multiple nucleation sites may be unseeded or seeded with a seed crystal such as 4 H or 6 H SiC.

20 Claims, 17 Drawing Sheets

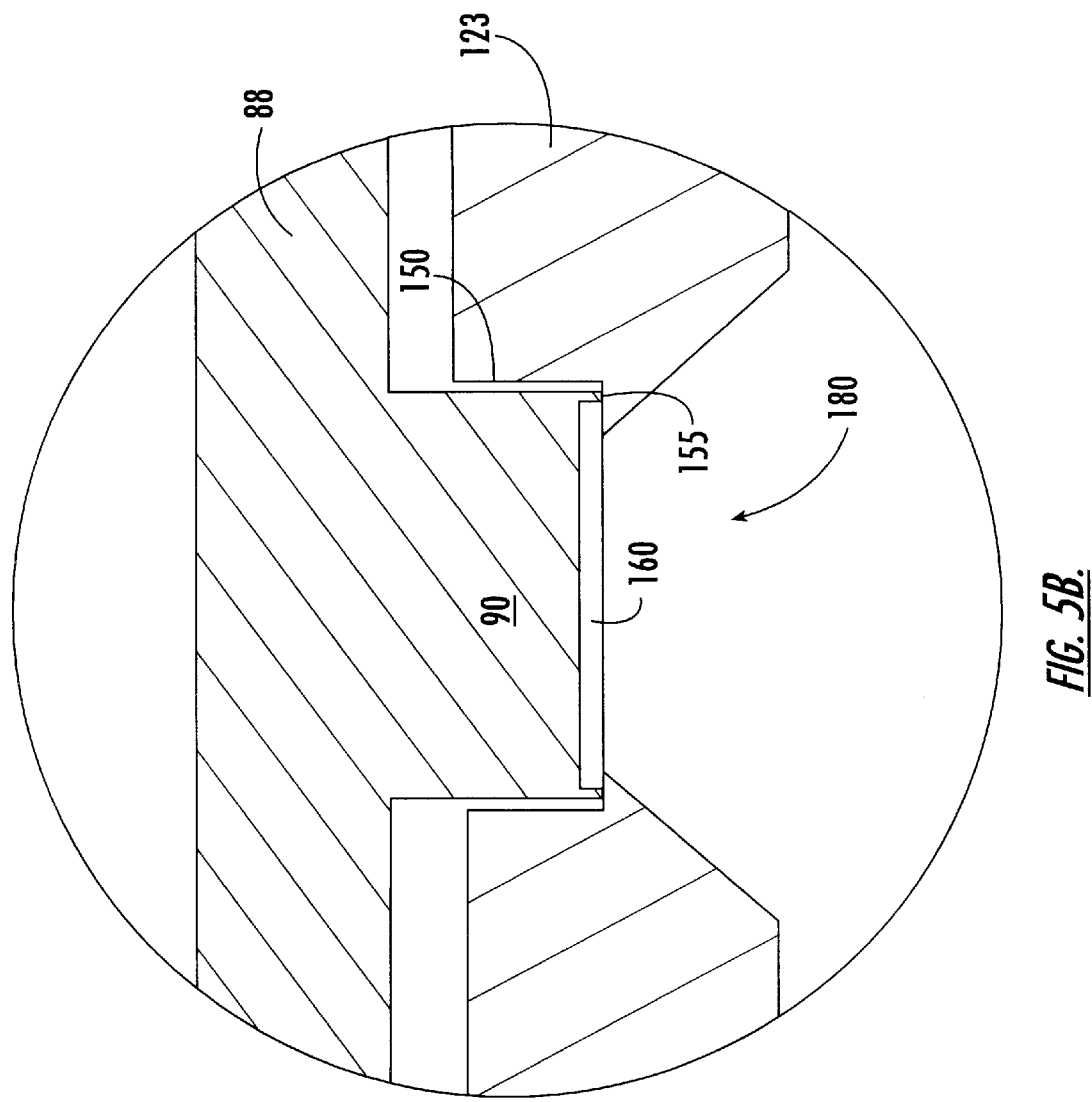

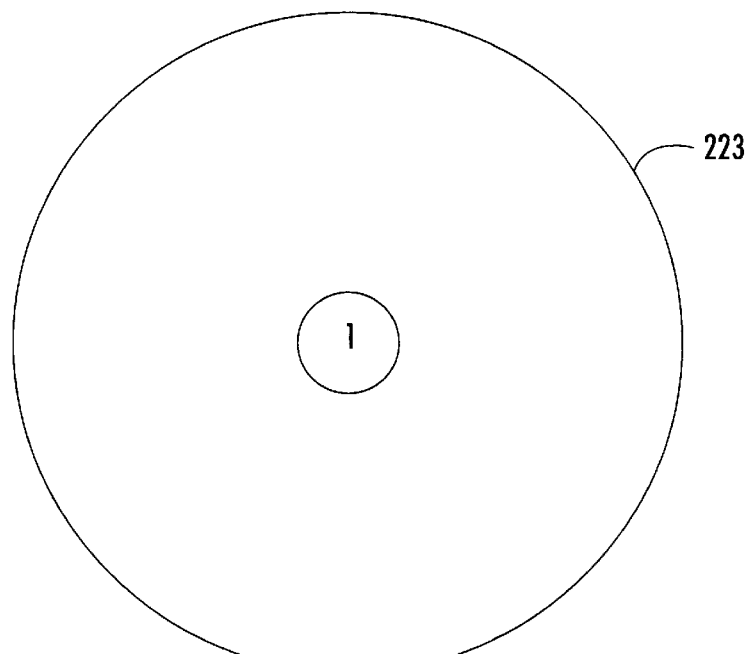
FIG. 14A.    t = 0
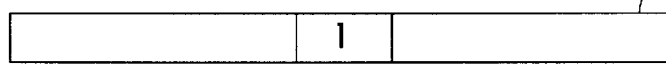
FIG. 14B.
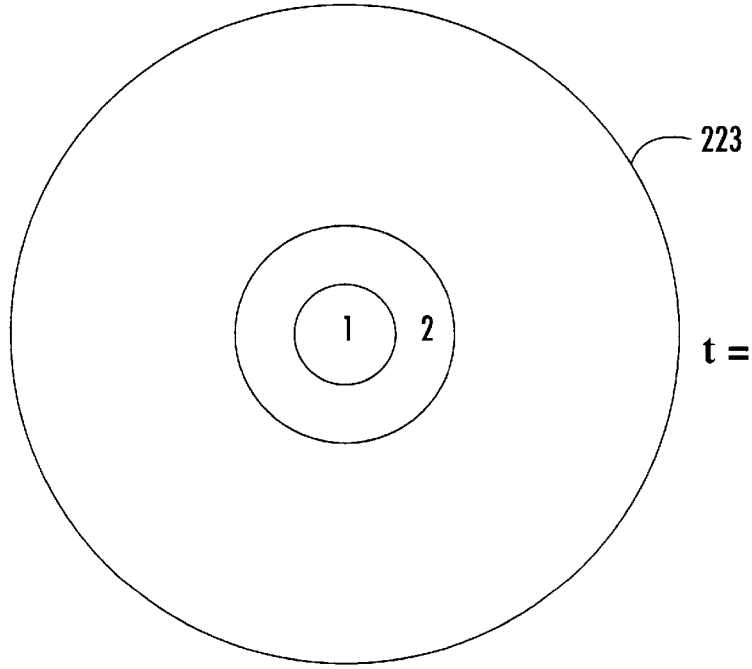
FIG. 15A.    t = 1 HOUR
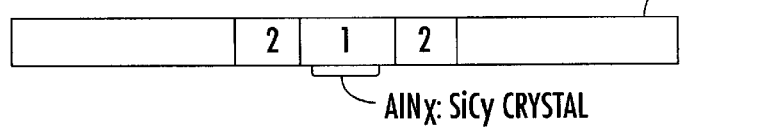
FIG. 15B.
AlN$_x$: SiC$_y$ CRYSTAL

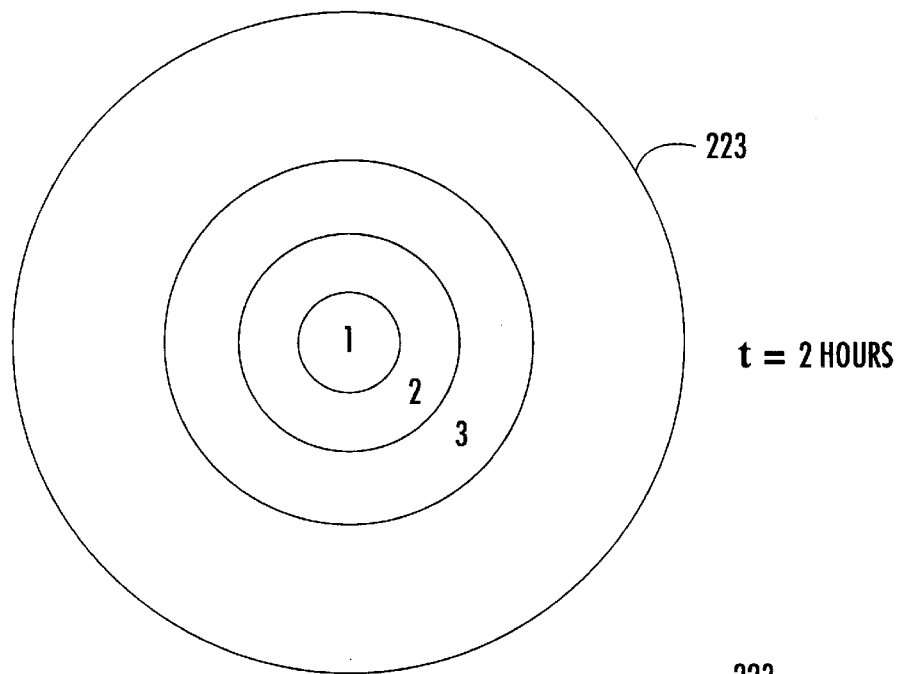
FIG. 16A.  t = 2 HOURS
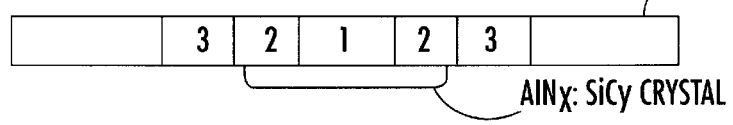
FIG. 16B.
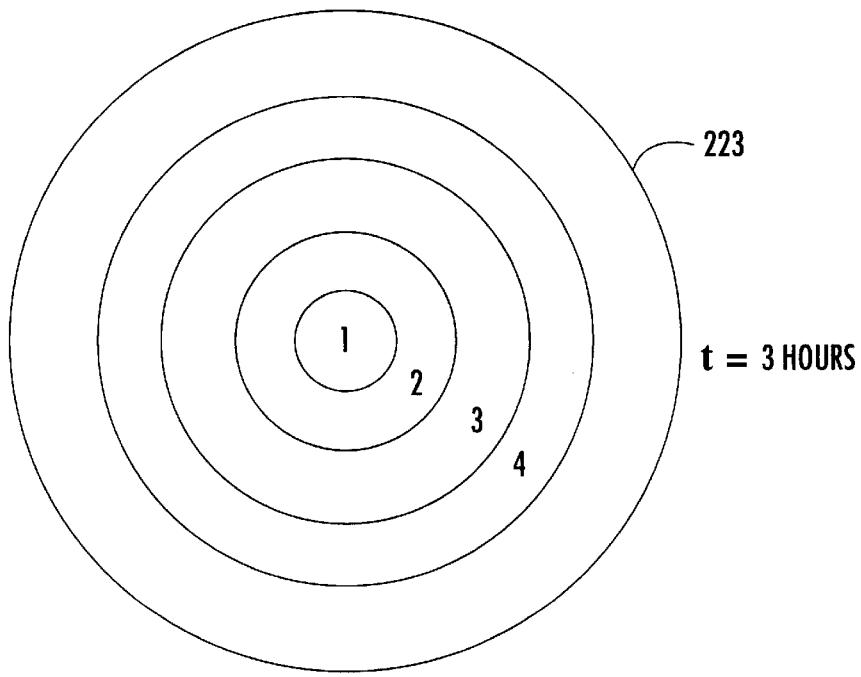
FIG. 17A.  t = 3 HOURS
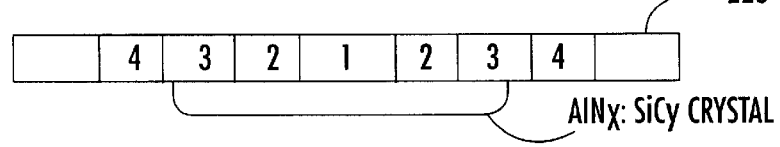
FIG. 17B.

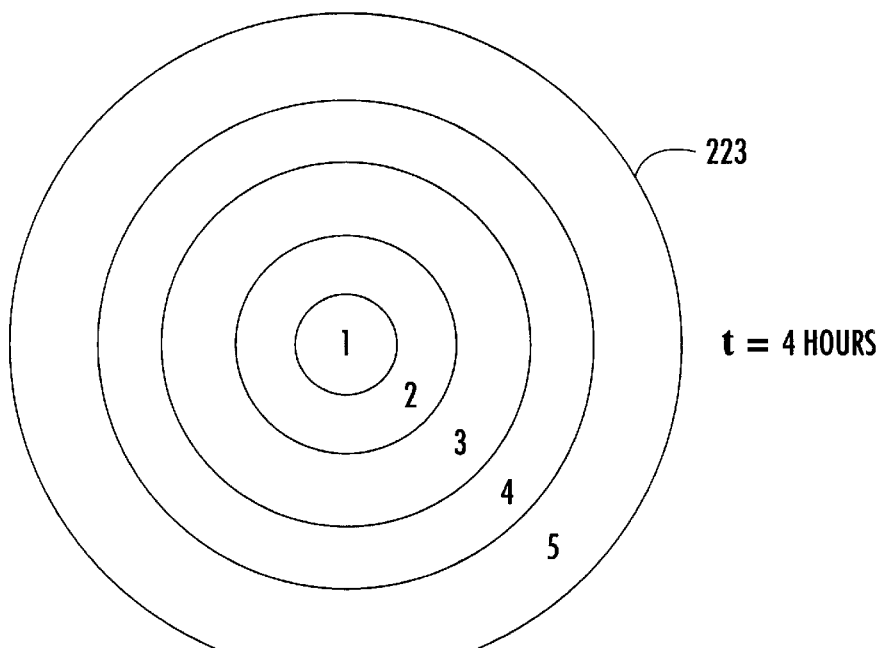
FIG. 18A.                                                    t = 4 HOURS
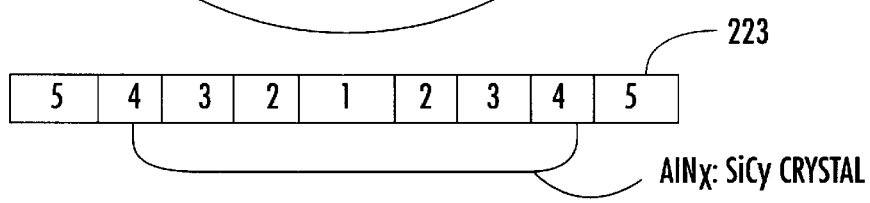
FIG. 18B.     AlN$_x$: SiC$_y$ CRYSTAL
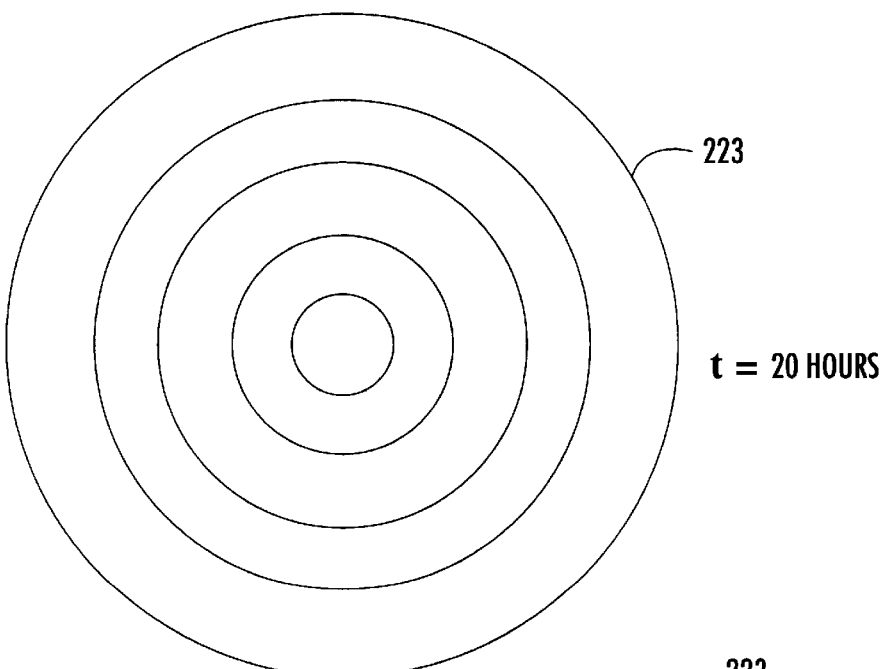
FIG. 19A.                                                    t = 20 HOURS
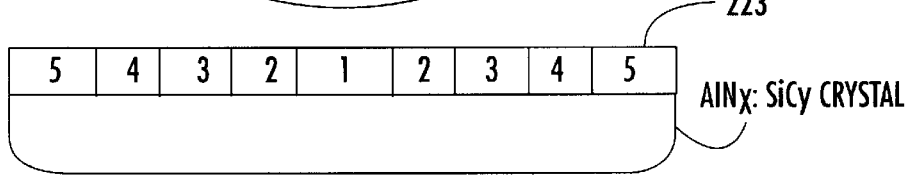
FIG. 19B.     AlN$_x$: SiC$_y$ CRYSTAL

PRODUCTION OF BULK SINGLE CRYSTALS OF ALUMINUM NITRIDE, SILICON CARBIDE AND ALUMINUM NITRIDE: SILICON CARBIDE ALLOY

FIELD OF THE INVENTION

The invention relates to the growth of semiconductor materials. More particularly, the invention relates to low cost, high output production of low defect density, low impurity bulk single crystals of aluminum nitride, silicon carbide and aluminum nitride:silicon carbide alloy.

BACKGROUND OF THE INVENTION

The physical and electronic properties of aluminum nitride (AlN) give it great potential for a wide variety of semiconductor applications. AlN has a wide energy bandgap (6.2 electron volts), high breakdown electric field and extremely high thermal conductivity. In fact, in Chow et. al *Wide Bandgap Compound Semiconductors for Superior High Voltage Unipolar Power Devices* (IEEE Transactions on Electron Devices, Vol. 41, No. 8, 1994) ranking all semiconductors materials, AlN is reported to have, excluding diamond, the highest figure of merit for unipolar power device performance.

In addition, the high thermal conductivity and high optical transmissivity (i.e., low optical density) of AlN make AlN an excellent candidate substrate material. Also, AlN is likely to be the optimum substrate for the growth of pseudo-binary inter metallic compounds such as $Al_{0.8}In_{0.2}N$ which have extremely high figures of merit for semiconductor performance (up to 4,413,000 times silicon). Although AlN has extraordinary properties for a semiconductor material and has tremendous commercial potential, AlN based semiconductor devices have been limited by the unavailability of large, low defect AlN single crystals. In the most successful prior work, Slack and McNelly demonstrated a method for growing AlN single crystals via sublimation in *AlN Single Crystals* (Journal of Crystal Growth 42, 1977). However, the time required to grow a 12 mm by 4 mm crystal was approximately 150 hours. This growth rate is far too low to ever allow the commercial production of AlN single crystals.

AlN has been alloyed with silicon carbide (SiC) in monocrystalline thin films produced, for example, by liquid phase epitaxy. Polycrystalline AlN:SiC alloys have also been produced by isostatic pressing processes. However, bulk single crystalline (monocrystalline) alloys of AlN:SiC have not been commercially produced.

Certain monocrystalline AlN:SiC alloys have promise for use as substrate materials that have superior electronic properties to either AlN or SiC. Physical and electronic properties can be tailored to specific device applications by selecting specific AlN:SiC alloy composition. For example, certain AlN:SiC alloys are direct bandgap materials which is an important property for optoelectronic devices and other electronic device applications. Furthermore, AlN:SiC alloys have other desirable electronic properties such as high electron hole mobility, high electron break down field, high saturated electron drift velocity, high thermal conductivity and a wide energy bandgap. Accordingly, there is a need for apparatus and processes for growing bulk single crystalline alloys of AlN:SiC, particularly such single crystalline alloys that are tailored in their makeup to meet specific needs, for example, specific needs in the electronics industry.

Silicon carbide (SiC) is rarely found in nature. It has, however, been manufactured for more than eighty years, in crystalline form, for abrasive products. Silicon carbide crystals found in nature and in abrasive products are generally black and not translucent because they contain substantial levels of impurity atoms.

In the 1950's the Lely process was developed at General Electric Company by which silicon carbide was sublimed and randomly deposited to produce small, thin silicon carbide crystals that were used in early silicon carbide semiconductor device development.

Because of the theoretically quite favorable electronic properties of silicon carbide, significant development activities were initiated during the 1960's and 1970's with the objective of growing large (bulk) crystals of low impurity silicon carbide for use in the production of semiconductor devices. These efforts finally resulted in the commercial availability of relatively low impurity, translucent silicon carbide crystals. These silicon carbide crystals are fabricated and marketed as very thin green, amber or blue (175 $\mu$m–400 $\mu$m) slices useful for semiconductor devices.

Recently, it has been discovered that relatively low impurity, translucent, single crystal silicon carbide may be grown with a desired color and thereafter fashioned by faceting and polishing into synthetic gemstones. These gemstones have extraordinary hardness, toughness, chemical and thermal stability, and a high refractive index and dispersion that produce unparalleled brilliance. The single crystals from which the gemstones are produced have been grown by sublimation according to techniques of the type described in U.S. Pat. No. Re. 34,061.

Silicon carbide crystals can be grown in a wide range of colors (including green, blue, red, purple, yellow, amber and black) and shades within each color by the appropriate selection of dopants (e.g., nitrogen and aluminum) and by varying the net doping densities (concentrations). Because of its wide bandgap, undoped ("intrinsic") silicon carbide crystals in the hexagonal or rhombohedral forms are inherently colorless. Thus, silicon carbide crystals offer the potential to be faceted and polished into gemstones of many various appearances, including that of relatively colorless diamond.

Because of the emerging recognition of the value of aluminum nitride, silicon carbide and alloys thereof for electronics applications and otherwise, there has developed an acute need for a low cost, high output process for producing low a defect density, low impurity bulk single crystals of these materials.

SUMMARY OF THE INVENTION

The present invention enables one to economically grow low defect density, low impurity bulk single crystals of AlN, SiC and AlN:SiC at high production rates.

The invention in one basic aspect is a method and system for allowing a flow of vapor species to deposit in an isotropic manner on the growing crystal interfaces provided by multiple nucleation sites that are preferentially cooled to a temperature lower than surrounding surfaces in the crystal growth enclosure.

The flow of source vapor species may be provided in a number of ways, for example, from AlN crystals, SiC crystals, AlN:SiC crystals, sintered AlN:SiC, hydrostatically pressed AlN:SiC, hydrostatically pressed and sintered AlN:SiC, AlN:SiC powder or other solid forms containing AlN:SiC, AlN, SiC, Al, N, Si or C as necessary to grow the desired crystals. Other embodiments of the invention utilize gas injection to provide the flow of source vapor. The source gas may take the form of $C_2N_2$, CN, vaporized paracyanogen, vaporized tetracyanoethylene, vaporized hexacyanobutadiene, vaporized Si, $SiH_4$, $AlCl_3$, $NH_3$, vaporized Al, $N_2$, atomic nitrogen, nitrogen ions, $N_2$ in combination with nitrogen ions or other gases that contain Al, N, Si or C that have been excited via microwave, laser or other energy source, or other gases that contain nitrogen, aluminum, silicon or carbon, alone or in combination. Furthermore, source vapor may be provided in part from solid or liquid source material and in part from gas source material(s), for example, the use of source vapor from molten Si and Al combined with $C_2N_2$ or CN.

The gas injector system can also be used to increase the effective effusion by providing a flow of effusion-assist gas such as $N_2$ or argon. The use of an effusion-assist gas increases the flow rate of gas past the growing crystal interface by adding additional flow to the source vapor flow.

The growth system may also utilize an injected gas that serves as both a source gas and an effusion-assist gas, for example, by injection of CN with or without an appropriate carrier gas such as $N_2$.

THE bulk crystals of the present invention may be grown with sufficient size for commercial application. While any useful size crystal may be grown according to the invention, in most applications the crystals will have a diameter of one-half inch to one inch and above.

The bulk single crystal alloys of the invention are grown at varying percentage ratios of AlN to SiC, with atomic percentages of the alloys being chosen to provide physical and/or electronic properties required for specific applications. The atomic percentages may typically reside in the range from about $AlN_{0.99}$:$SiC_{0.01}$ to $AlN_{0.01}$:$SiC_{0.99}$. In certain embodiments, the alloy composition is largely determined by the relative sublimation or vaporization rates of the solid or liquid source material constituents under the prevailing temperature and pressure conditions.

Sometimes herein the bulk single crystals of AlN, SiC or AlN:SiC are referred to as bulk single crystals of $AlN_x$:$SiC_y$ where x+y=1 and x is 1→0 and y is 0→1.

Terms such as "single crystal of AlN:SiC alloy", "AlN:SiC single crystalline alloy", and like terms, as used herein, refer to a composition of matter containing AlN and SiC in single crystalline form or other form, such as solid solution, having sufficient long range order to provide substantially isotropic electronic and/or physical properties along each axis of the crystalline structure.

BRIEF DESCRIPTION OF THE DRAWINGS

Some of the features of the invention having been stated, other features will appear as the description proceeds, when taken in connection with the accompanying drawings, in which—

FIG. 5B is a further enlarged view of the area within the circle 5B of FIG. 5A.

FIGS. 14A, 14B 15A, 15B, 16A, 16B, 17A, 17B, 18A, 18B through 19A, 19B schematically show an alternative system for sequentially preferentially cooling radially expanding nucleation sites over the course of a twenty hour crystal growth cycle.

DETAILED DESCRIPTION OF THE INVENTION

Figure 1:
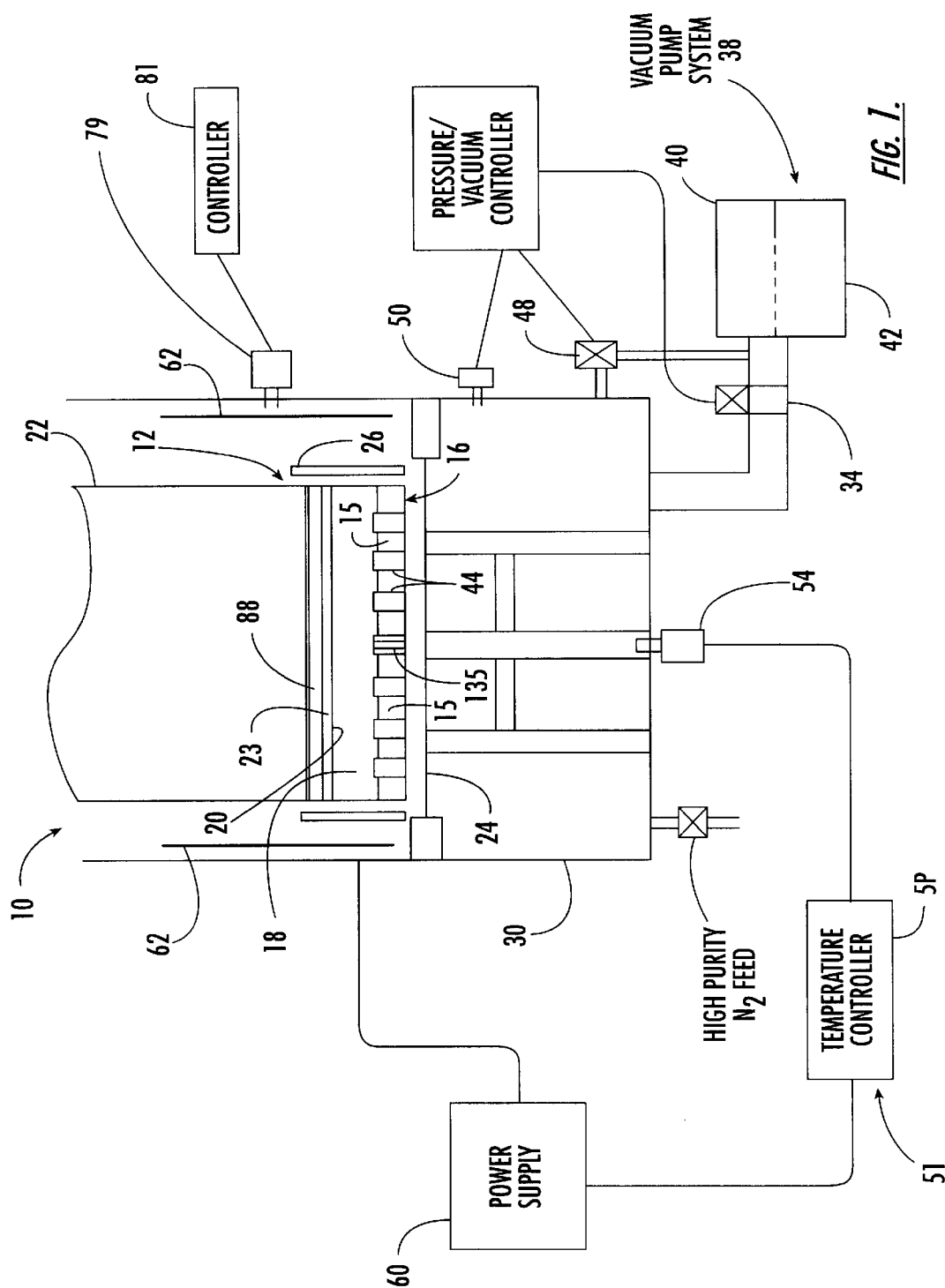
FIG. 1 is a schematic representation of one overall system for growing bulk single crystals of AlN, SiC or AlN:SiC alloy in accordance with the present invention.

While the present invention will be described more fully hereinafter with reference to the accompanying drawings, in which aspects of the preferred manner of practicing the present invention are shown, it is to be understood at the outset of the description which follows that persons of skill in the appropriate arts may modify the invention herein described while still achieving the favorable results of this invention. Accordingly, the description which follows is to be understood as being a broad, teaching disclosure directed to persons of skill in the appropriate arts, and not as limiting upon the present invention.

Referring to the drawings, there is shown one form of a crystal growth system 10 of the present invention that is designed for low cost, high output production of low defect density, low impurity bulk single crystals of AlN, SiC and AlN:SiC alloys. System 10 includes a crystal growth enclosure in the form of an upstanding cylindrical sublimation furnace 12 having a lower zone 16 containing solid source material 15, a central zone 18 containing a selected atmosphere, for example $N_2$, through which sublimed source vapor species travel to the nucleation sites, and an upper zone 20 where crystal growth occurs when the sublimed source vapor species recondense at the preferentially cooled nucleation sites. A water-cooled stainless steel heat sink rod 22 serves to preferentially cool the nucleation sites through a graphite cooling disc member 23 that overlies the nucleation sites. Furnace 12 is heated by a horizontal plate heating element 24 and an upstanding cylindrical heating element 26. A stainless steel chamber 30 serves as the outer containment structure for system 10. Chamber 30 is water cooled (detail not shown) according to principles well known in the art.

System pressure within chamber 30 below 10 torr is controlled via a throttle valve 34 (for example, a 3 inch diameter throttle valve manufactured by MKS Instruments, Inc. of Andover, Mass., USA) located in series with a vacuum pumping system 38. In accordance with techniques known in the art, the vacuum pumping system 38 is composed of a mechanical pump 40 to reduce the system pressure to the $10^{-3}$ torr and a turbomolecular pump 42 to pump the system down to $10^{-5}$ torr. Pressure control above 10 torr is maintained through a magnetic control valve 48 that is also in series with vacuum pumping system 38. System pressure is measured from $10^{-3}$ torr to 1,000 torr with a highly accurate temperature controlled absolute capacitance manometer 50 such as the MKS Instruments, Inc., model no. 390. Horizontal heating element 24 serves as the primary heat source for system 10, while cylindrical heating element 26 provides supplemental heat and also provides a means for controlling heat losses at the perimeter of furnace 12.

Temperature control is facilitated by an optical pyrometer 54 (FIG. 1) sited on the back of the heating element. Pyrometer 54 provides a constant input signal to a digital temperature controller 56 that maintains the temperature at a set point by controlling the output of a power supply 60. According to principles known in the art, heat generated by heating elements 24, 26 is shielded from the stainless steel walls of chamber 30 by heat shields 62, preferably formed of graphite. Regardless of the precise form taken by the horizontal plate heating element, such an arrangement enables the system to maintain a highly uniform thermal profile across a large diameter.

Figure 2:
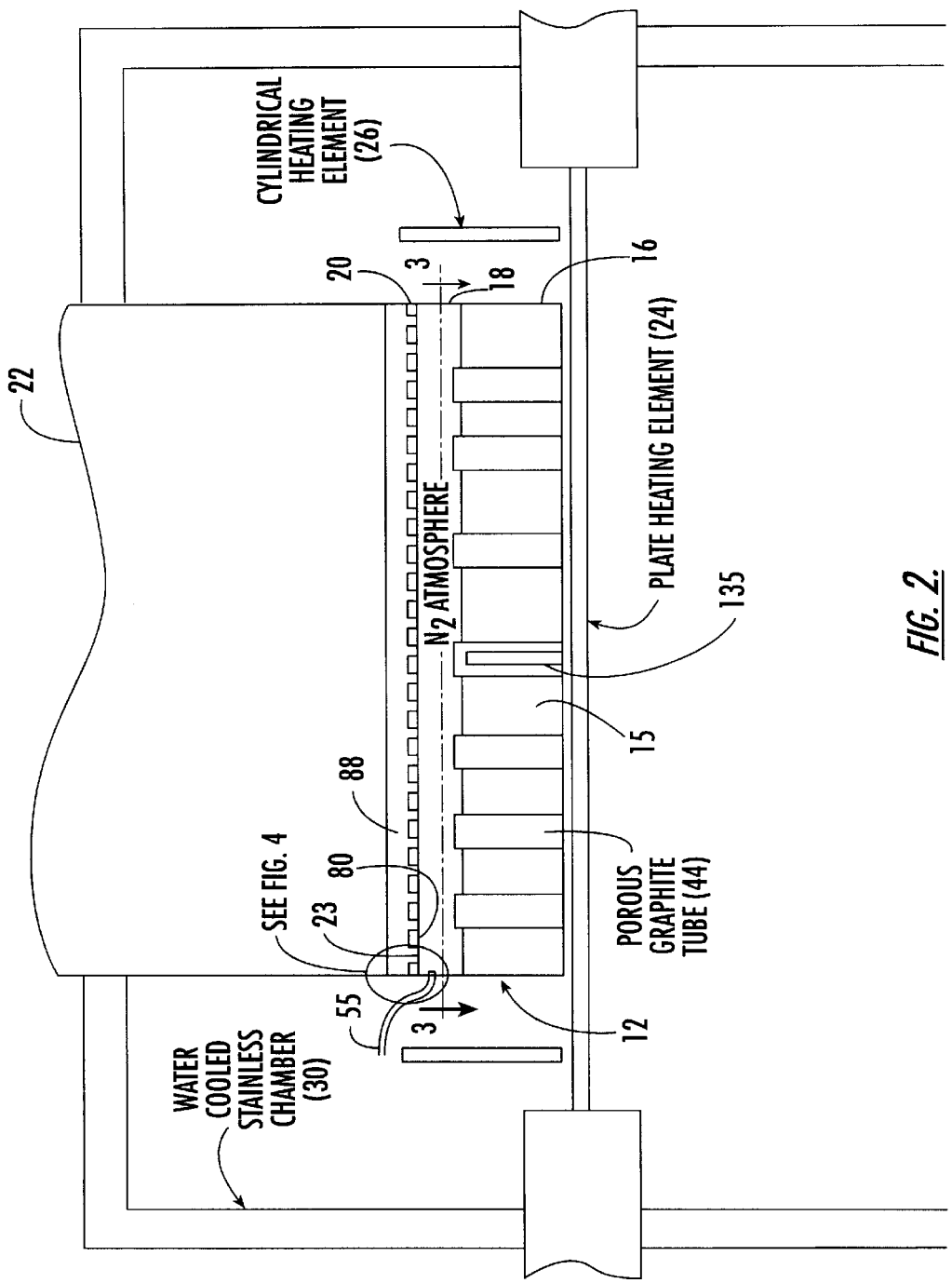
FIG. 2 is a side view of the furnace portion and related components of the crystal growth system shown in FIG. 1.
Figure 3:
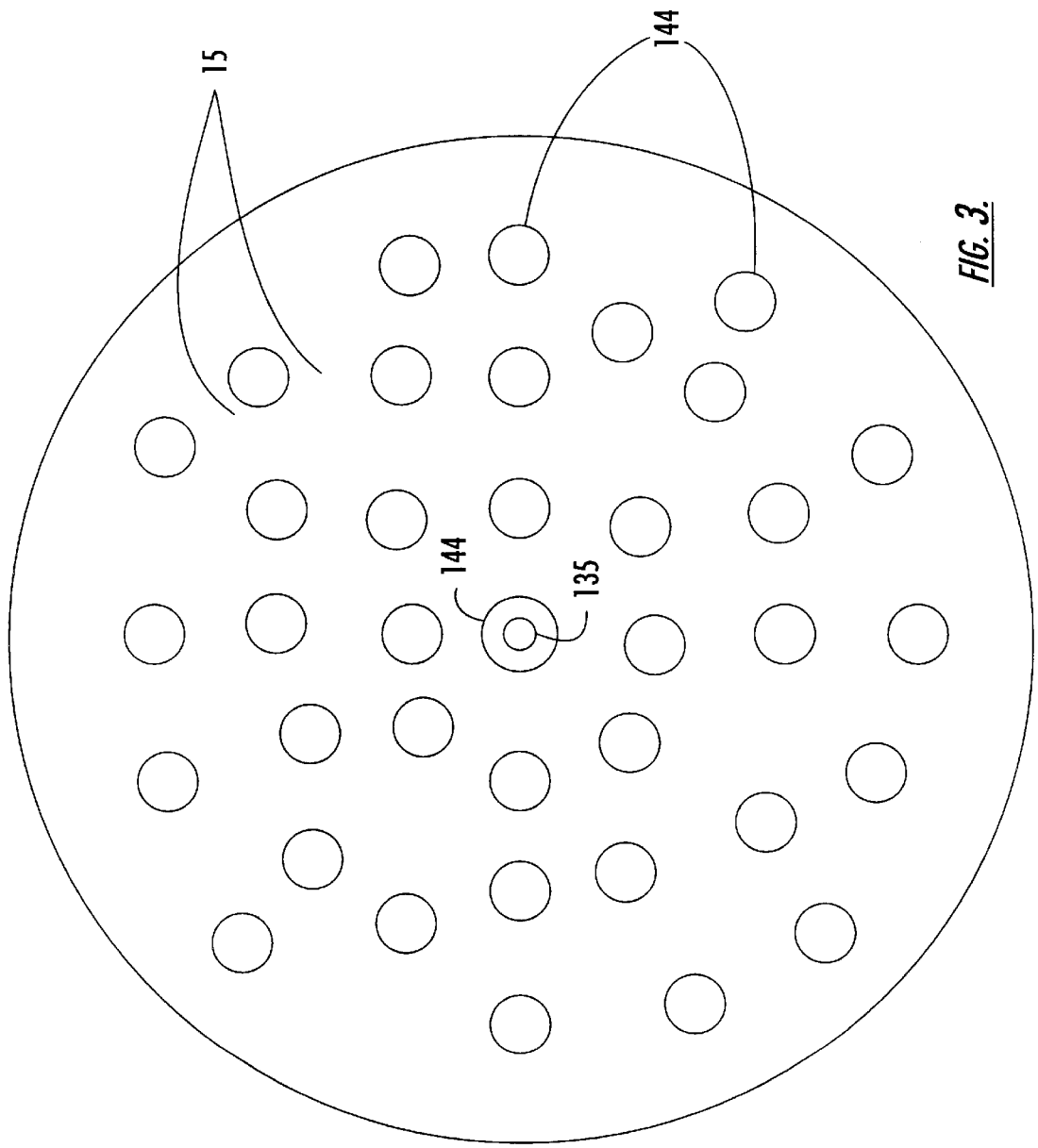
FIG. 3 is a section view taken substantially along line 3—3 of FIG. 2 showing the source material and associated upright porous tubes at the bottom of the furnace.

Furnace lower zone 16 contains source material 15 in the spaces between a plurality of upstanding porous graphite tubes 44 (FIG. 2 and 3). During operation, when the solid source material preferentially sublimes to produce vapor species for growing the crystals, the vapor species move through the walls of porous tubes 44 and are thereby transported through the open tops of the tubes to furnace central zone 18. As discussed above, the source material may take the form of AlN powder, SiC powder, AlN:SiC alloy solid material (for example, isostatically pressed AlN:SiC solid pellets), a combination of AlN and SiC powders, other solid forms containing Al, other solid forms containing Si, or other material that will sublime or vaporize to produce the desired vapor species. Tubes 44 are positioned in furnace lower zone 16 so that the sublimed vapor species will not have to diffuse more than a predetermined distance, for example 3 cm, before reaching the porous wall of one of the tubes.

As described below in more detail, the thermal gradient between the source material (at, for example, 2400° C.) and the preferentially cooled nucleation sites (at, for example, 2200° C.) along with the chemical gradient drive the vapor species through tubes 44 and central zone 18 to the nucleation sites.

The nucleation sites 80 are located on the lower face of the circular graphite disc member 23 that serves as the upper boundary of the furnace upper zone 20. Disc member 23 is held in physical contact and heat transfer relationship to an overlying circular graphite member 88 that serves to preferentially cool the nucleation sites. Member 88 is, in turn, threadingly connected to the stainless steel water cooled rod 22 that serves as the heat sink.

Figure 4:
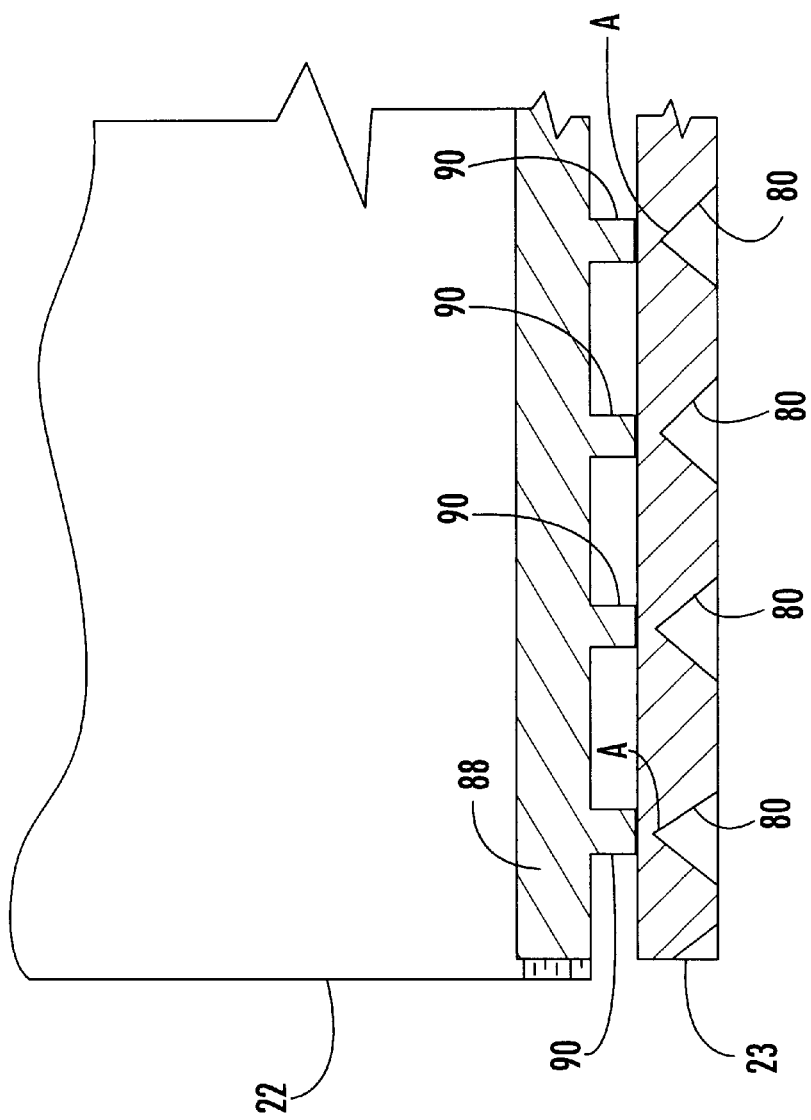
FIG. 4 is an enlarged view of the area in circle 4 in FIG. 2 showing a portion of the upper furnace plate containing unseeded nucleation sites and the associated heat sink structure having downwardly depending pegs at each nucleation site for providing preferential cooling thereat.

FIG. 4 shows, on an enlarged scale, four adjacent nucleation sites 80 on disc member 23 and portions of the overlying member 88 and heat sink rod 22. In one embodiment, disc member 23 is a circular, thin solid graphite disc having a thickness on the order of 0.5 cm and a diameter (e.g. 45.5 cm) that is approximately the same as the diameter of cylindrical furnace 12. A large number of unseeded nucleation sites 80 (e.g. 254 sites) are formed in disc member 23 by removing material having a conical shape from the underside of member 23. In one preferred embodiment, each conical nucleation site 80 may extend to an apex point A within approximately 0.05 cm of the upper surface of disc member 23. The overlying circular member 88 has approximately the same diameter as disc member 23 and includes downwardly projecting pegs 90, with one peg overlying each nucleation site 80 in physical and heat transfer relationship with respect to disc member 23. Preferably, the overlying circular member 88 is threaded at its periphery and connected by mating threads to heat sink rod 22. Thus, in operation, pegs 90 press downwardly on the upper surface of disc member 23 just above each nucleation site 80 in order to preferentially cool each site. The relatively short heat transfer path (e.g. 0.05 cm) from the apex A of each nucleation site 80 aids in significant localized cooling throughout the crystal growth operation, and especially at the beginning when initial nucleation occurs at or near the apex. Both the conical nucleation sites and the pegs may be formed in respective members 23, 88 by computer controlled milling operations, or like operations that are well known in the art. It will be appreciated that the apex A of each conical nucleation site 80 is cooled to the lowest temperature within the furnace crucible for two related, but distinct reasons. First, the apex is positioned in direct, underlying proximity to a respective one of the cooling pegs 90. Second, of all the exposed surfaces on the underside of disc member 23, the apex has the shortest heat transfer path to the heat removal means above disc member 23. Thus, even without the use of discrete cooling pegs overlying each nucleation site (i.e. utilizing uniform heat removal across the top of disc member 23) the nucleation sites, particularly at each apex A, would be the coolest surfaces on the underside of disc member 23 and would therefore serve as nucleation sites. Also, if disc member 23 were formed without structural formations encouraging localized cooling, e.g., with a flat underside, but with the overlying cooling pegs, the localized areas below each peg would be the coolest surfaces on the underside of disc member 23 and would serve as nucleation sites. Nevertheless, a combination of localized heat removal (e.g., pegs 90) and structural formations encouraging localized cooling (e.g., nucleation sites 80) is preferred.

Figure 5A:
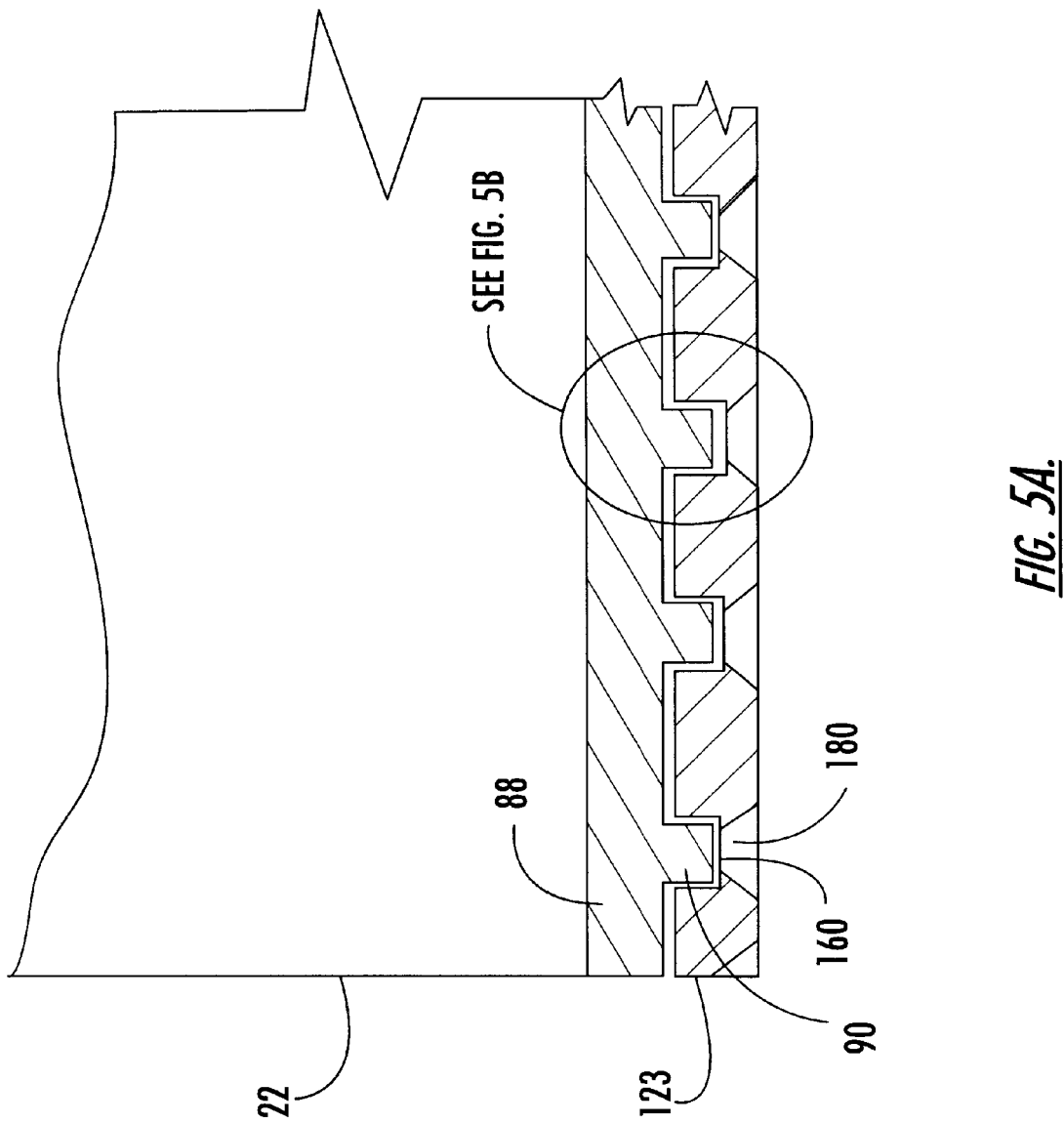
FIG. 5A is a view similar to FIG. 4 showing an alternative upper furnace plate with seeded nucleation sites.

FIGS. 5A and 5B show a structure similar to that of FIG. 4, but with a disc member 123 that provides seeded nucleation sites 180 instead of the unseeded sites of FIG. 4. In the illustrated embodiment, disc member 123 has the same diameter as disc member 23 and can be interchangeably used with the same overlying member 88, the same thermal sink rod 22 and without changing the furnace structure. Each nucleation site 180 on disc member 123 is formed by first milling out a conical portion from the underside of member 123 as described above, and thereafter drilling a cylindrical bore 150 directly overlying the conical portion. Bore 150 is sized slightly larger than peg 90 and extends to a depth sufficient to create an annular, horizontal shoulder 155 (FIG. 5B) where the cone is truncated. Shoulder 155 serves to support a circular seed 160 which is, in turn, engaged on its upper surface by its respective peg 90. Thus, the alternative structure of FIGS. 5A and 5B serves to present seeded preferentially cooled nucleation sites. In a particular embodiment, disc member 123 has a diameter of approximately 45 cm, a thickness of approximately 0.5 cm and a cylindrical bore 150 having a diameter of approximately 1.0 cm. Bore 150 extends approximately halfway through disc member 23. Seed 160 is a 0.08 cm thick, approximately 1 cm diameter 6 H or 4 H SiC seed cut on axis with the basal plane exposed. Shoulder 155 has a width of approximately 0.1 cm, so that an approximately 0.8 cm diameter portion of seed 160 is exposed.

While systems of the invention may be operated on a largely closed basis without significant effusion, preferred embodiments include effusion openings that permit venting or effusion of gases from the furnace central chamber 18 so as to remove impurities and stoichiometric excess and thereby maintain the proper source vapor constituents at the growing crystal interfaces afforded by the nucleation sites. To this end, effusion may be provided by a selected number (e.g. 8) effusion outlets 55 (FIG. 2) symmetrically disposed at the perimeter of furnace central zone 18. Alternatively, effusion openings may be formed through circular disc member 23 in a symmetrical fashion, for example, with one or more effusion openings (not shown) located at each nucleation site. The effusion assist gas, e.g. $N_2$, that enters the system at the high purity $N_2$ feed (FIG. 1) may be directed to a thermally insulated effusion assist gas conveyance tube 135 that extends upwardly through the centermost porous graphite tube 44 as shown in FIG. 2 and 3. More details of systems and processes for effective effusion at a growing crystal interface are contained in the applicant's copending application Ser. No. 08/730,882, filed Oct. 17, 1996, now U.S. Pat. No. 5,858,086 the contents of which are incorporated herein by reference in entirety.

The components that are exposed to the high furnace temperatures preferably are formed of a suitable material that is not chemically reactive in the furnace environment and will withstand temperatures up to approximately 2400° C. To this end, these components are preferably formed of polished graphite, polished silicon carbide, polished tungsten, or other suitable material, with polished graphite being preferred.

The temperature at the growing crystal interface is carefully controlled to create the desired thermal gradient by use of an optical pyrometer 79 and associated controller 81 according to principles known in the art.

Figure 6A:
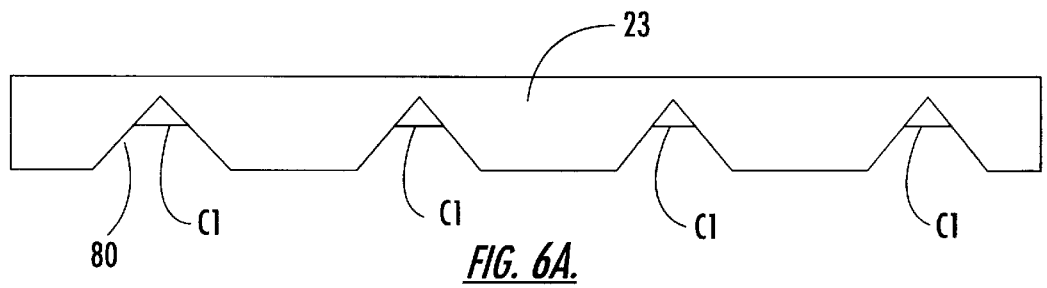
FIGS. 6A, 6B, 6C, 6D show the unseeded nucleation sites of FIG. 4 at various stages of a representative crystal growing operation.
Figure 6B:
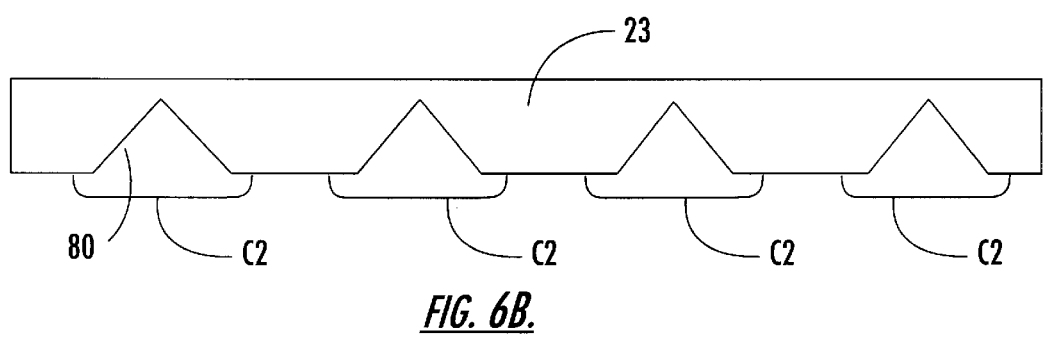
Figure 6C:
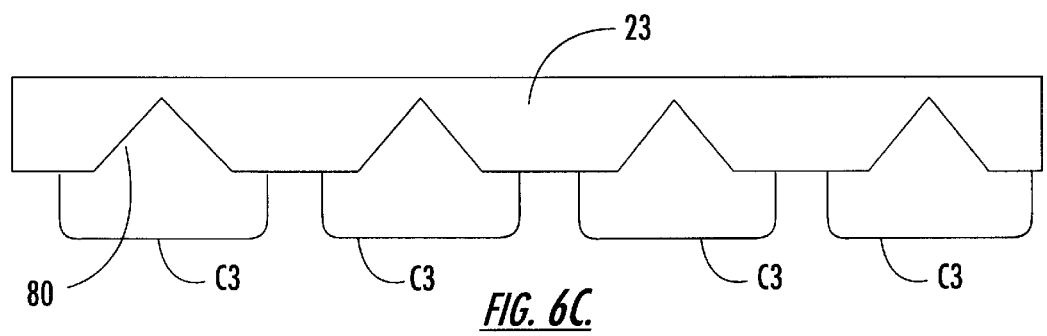
Figure 6D:
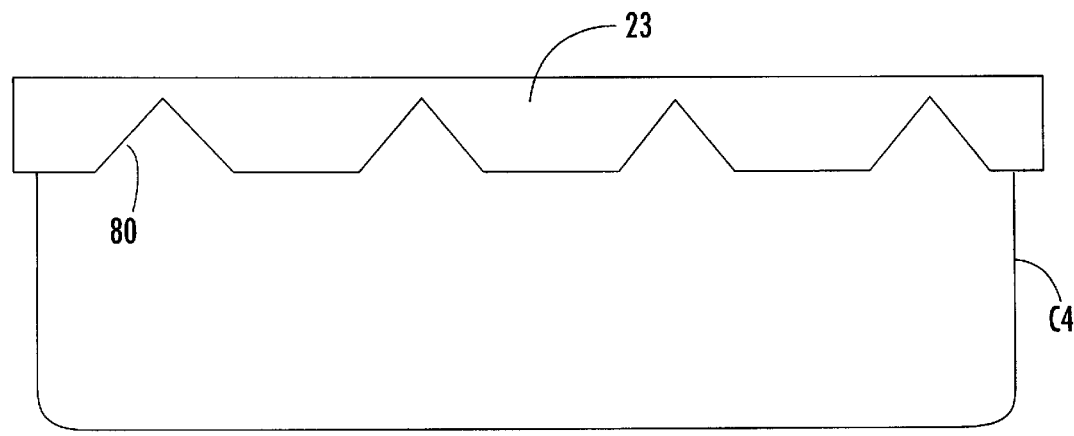
Figure 7A:
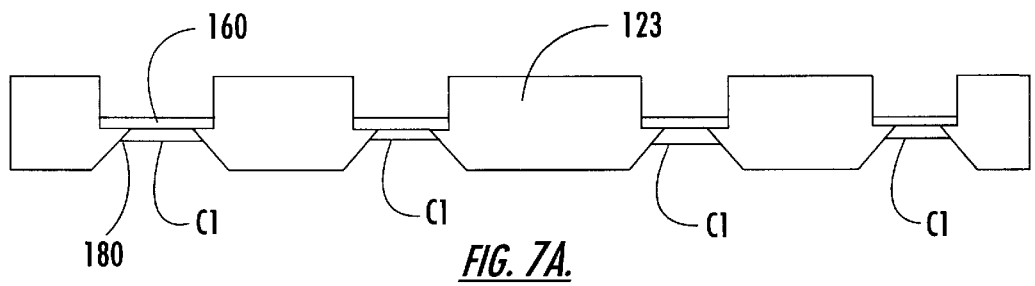
FIGS. 7A, 7B, 7C, 7D show the seeded nucleation sites of FIG. 5 at various stages of a representative crystal growing operation.
Figure 7B:
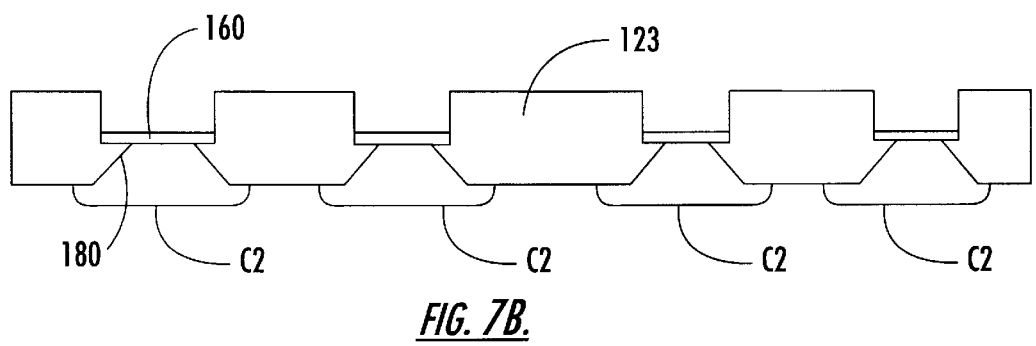
Figure 7C:
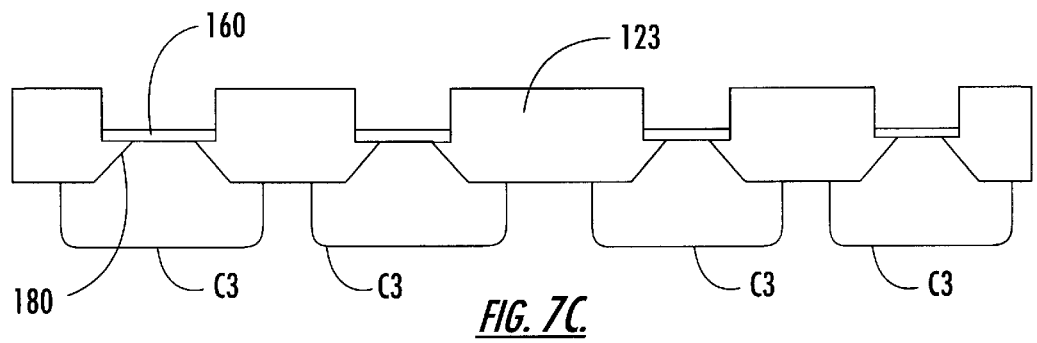
Figure 7D:
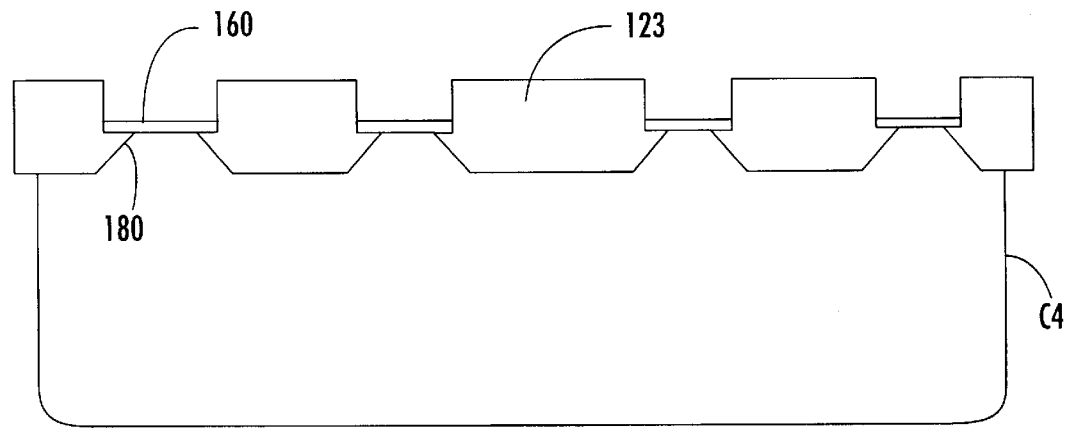

FIGS. 6A–6D show the sequential growth of bulk single crystals at four adjacent unseeded nucleation sites 80. FIG. 6A illustrates the initial nucleation C1 of the crystal which will typically occur at the coolest region which is at or near the apex of the conical nucleation site. FIG. 6B shows the continued growth C2 of the crystal just beyond the conical opening. FIG. 6C shows the continued growth C3 of the crystal further beyond the conical structure. FIG. 6D shows the situation where the nucleation sites are close enough together that the growth C4 of adjacent crystals in the horizontal plane bring adjacent crystals into contact. In this regard, during longer crystal growth operations under favorable growth conditions, a large plate of single crystalline structure may be grown.

FIGS. 7A–7D illustrate a similar sequential crystal growth pattern for the seeded nucleation sites 180.

Operation of the above-described crystal growth system will be described in more detail in the Example below.

EXAMPLE

A crystal growth system 10 incorporating the unseeded preferentially cooled nucleation sites of FIG. 4 is constructed and operated in accordance with the following parameters to produce bulk AlN:SiC alloy single crystals:

Inside diameter of water cooled chamber 30: 122 cm

Inside diameter of furnace crucible containing the source material: 46 cm

Height of porous tubes 44: 20.32 cm

Diameter of porous tubes: 3 cm

Number of porous tubes: 37

Source material: high purity 70% AlN:30% SiC powder

Tube volume: 16%

Source material volume: 84%

Weight of source material:33,625 gm

Number of nucleation sites: 254

Structure of nucleation sites: unseeded, preferentially cooled

Temperature at bottom of source material: 2350° C.

Nucleation site temperature: 2125° C.

Thermal gradient from bottom of source material to nucleation sites: 9.3° C./cm

Conversion rate of source material to crystals: 22%

Crystal formation: 7397 gm (36,987 carats)

After loading the source material and aligning and securing the thermal sink rod 22, member 88 and pegs 90 in heat transfer relation with respect to the nucleation sites, the system is pumped down to $10^{-3}$ torr with the mechanical vacuum pump in a linear ramp of 20 minutes. The turbomolecular pump is used to reduce the chamber pressure to $10^{-5}$ torr in 30 minutes. The growth chamber is back filled with high purity $N_2$ to a pressure of 760 torr. The furnace crucible is then heated to a temperature of 300° C. Next, the growth chamber in the central furnace zone is pumped down to a pressure of $10^{-3}$ torr. The system is then back filled with high purity $N_2$ to a pressure of 1,000 torr.

The pressure is held constant at 1,000 torr by throttling gas through the magnetic control valve while the crucible bottom temperature, as measured by the optical pyrometer, is increased from 300° C. to 2,350° C. in a linear ramp over 2 hours and 15 minutes.

Next, the system pressure is reduced to 8 torr in a linear ramp over 30 minutes. The seed temperature, as measured by the optical pyrometer, is held at 2,125° C. by adjusting the water flow to the thermal sink.

Next, $N_2$ effusion gas is flowed at a total rate of 45 standard cubic centimeters per minute via an MKS Instruments mass flow controller.

The system is then held in this configuration for 20 hours with an effusion rate of $N_e$=28% of $N_t$. Next, the crucible temperature is reduced from 2,350° C. to 1,200° C. in a linear ramp over a period of 1 hour and 30 minutes. The system is then back filled with nitrogen to a pressure of 760 torr in a linear ramp over a period of 1 hour as the power to the heating elements is reduced to zero in a linear ramp at the same time. After two hours the crucible is removed from the crystal growth chamber. Single crystalline AlN:SiC forms at the nucleation sites at a thickness in the range of about 14 mm to 22 mm. Over the course of the growth cycle the crystals at adjacent nucleation sites grow outward to form common boundaries, resulting in a large plate or plates containing a number of individual single crystals. (See FIG. 6D.)

Figure 8:
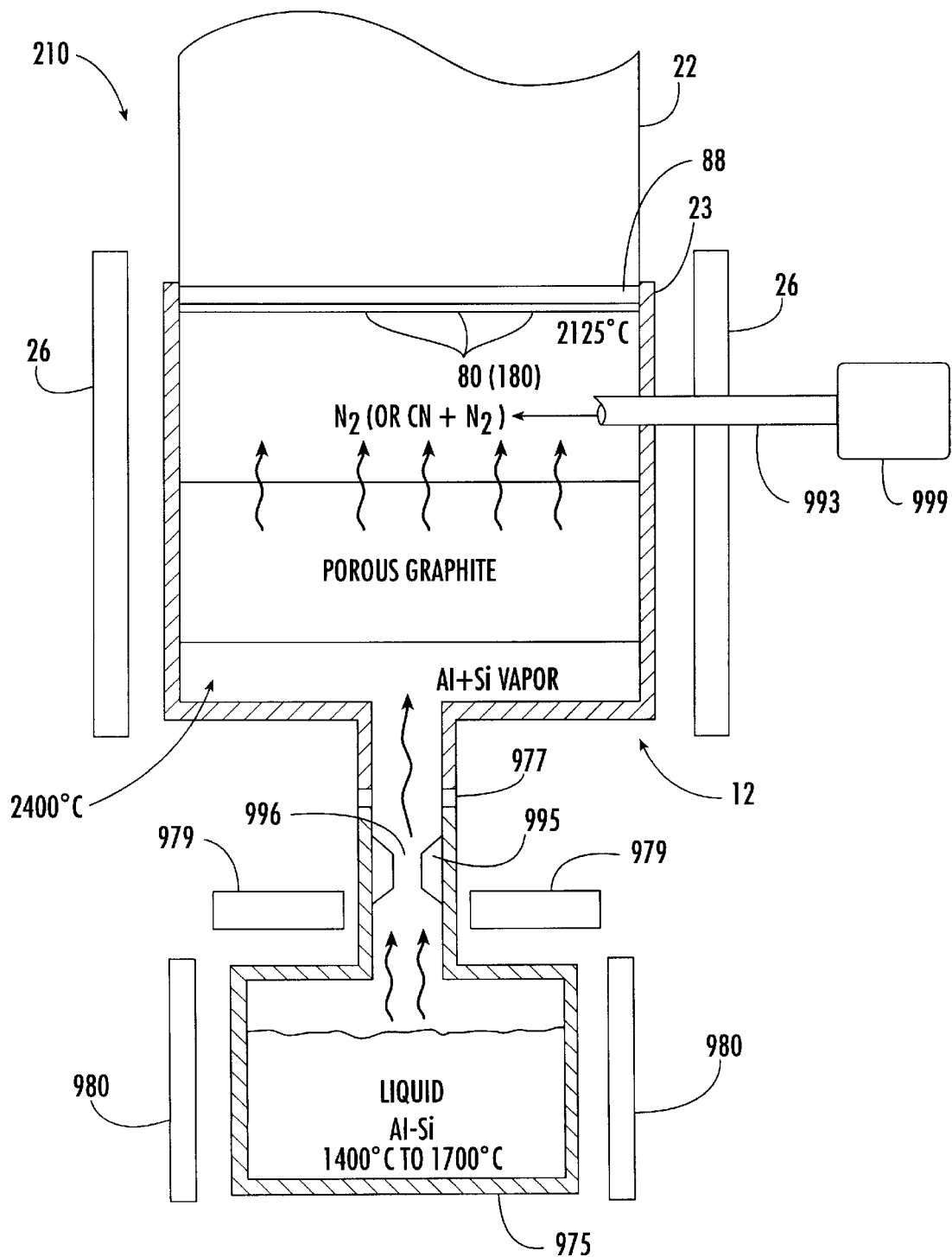
FIG. 8 is a schematic representation of portions of an alternative system for growing bulk single crystals of AlN:SiC alloy wherein Al and Si source vapor species emanate from a liquid Al—SiC melt and flow through a porous graphite medium.

FIG. 8 illustrates an alternative crystal growth system incorporating a vapor source apparatus 210 that is utilized to create a flow of Al, Si, N and C source vapor. In this system Al+Si vapor produced by heating liquid Al—Si to a specific temperature is combined with C and N vapor in the growth crucible to produce the desired flow and stoichiometry of source vapor. The area inside the growth crucible near the seeded or unseeded nucleation sites becomes saturated with Al, Si, C and N components that react to form AlN:SiC single crystalline alloy at the nucleation sites. More particularly, vapor source apparatus 210 includes the same or similar disc member 23, nucleation sites 80, pegs 90, heat sink rod 22 and effusion openings as shown in FIGS. 1, 2 and 4. Liquid Al—Si is contained in a lower crucible 975 that if required, as in the case of a cold crucible, may be electrically insulated at 977 by a BN insulator ring, or a physical gap, or other suitable means. Thermal insulation may be provided by heat shields 979. Crucible 975 may be a cold crucible, for example, a water-cooled copper crucible the contents of which is heated by a water-cooled induction heating coil 980. Alternatively, crucible 975 may be formed of high density graphite, pyrolytic graphite, silicon carbide coated graphite or boron nitride. These crucibles may be heated by either resistance heating or induction heating, as appropriate. The liquid Al—Si is maintained at a temperature sufficient to create a suitable vapor flow under the conditions maintained in the crucible, particularly crucible pressure. For example, for a 30% AlN/70% SiC (atomic percentage) composition the total Al and Si vapor pressure preferably is on the order of 5.46 torr at 1727° C. To create a suitable vapor flow rate, a temperature above about 700° C. is preferred. The Al and Si source vapor passes through a C containing gas-permeable medium such as porous graphite that provides C source vapor species. Additionally, a source of N vapor species is provided through a gas injector 993 in the form of $N_2$ or other N containing gas as discussed above. The gas injected through injector 993 may also take the form of a C and N containing source gas. In one embodiment, the C and N containing source gas is CN that is transported in an appropriate carrier gas such as $N_2$. The flow of the C and N containing source gas is achieved by an appropriate apparatus such as, in the case of CN, utilizing a thermal mass controller 999 that controls the flow of $N_2$ across paracyanogen at an elevated temperature (e.g. >850° C.) so that a desired flow of CN in $N_2$ is produced. System 210 includes a horizontal baffle plate 995 above the molten liquid Al—Si to facilitate transportation of Al and Si source vapor into the portion of the growth crucible that contains the nucleation sites. More particularly, horizontal baffle plate 995, containing a central opening 996, extends across the flow passage through which the Al and Si source vapor flows to create a pressure gradient thereacross and a resultant velocity increase to the Al and Si vapor moving into the growth crucible. This arrangement serves to reduce the back diffusion of CN or other C and N containing gases toward the liquid Al—Si, while also serving to propel the Al and Si source vapor toward the growing crystal interface. This is particularly important when the crystal growth temperature is higher than the temperature required to vaporize the liquid Al and Si. As shown in FIG. 8, in one representative crystal growth cycle the liquid Al—Si in crucible 975 may be held at 1400° C. to 1700° C. to produce sufficient Al+Si vapor at system pressure. The bottom of the furnace crucible is at approximately 2400° C. while the nucleation sites are preferentially cooled to approximately 2125° C. For a furnace chamber having a height of 20 cm, this produces a thermal gradient of approximately 11.25/cm.

Figure 9:
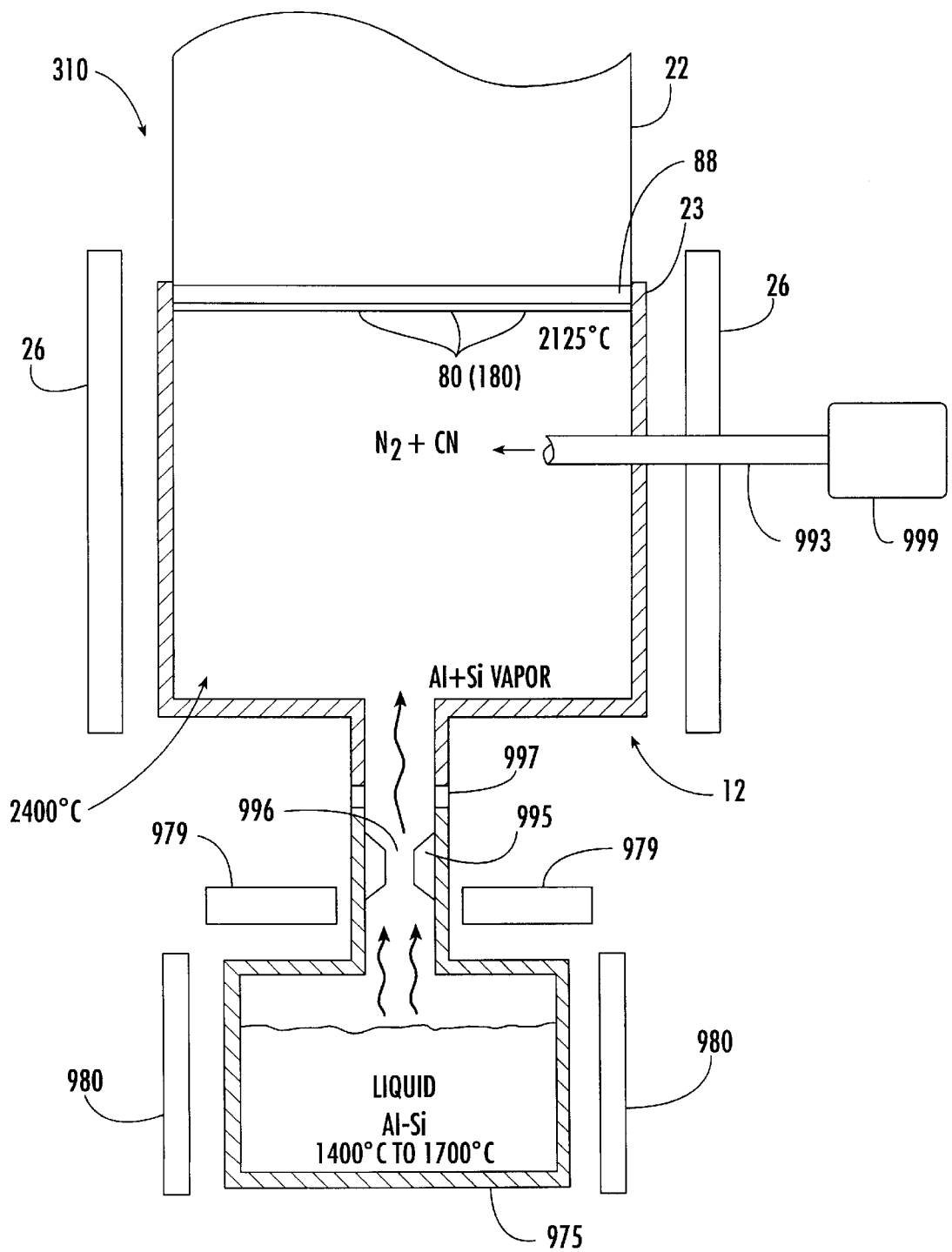
FIG. 9 shows a system similar to the system of FIG. 8 but with the porous graphite medium removed and the carbon vapor species being provided by injected CN gas.

FIG. 9 shows a crystal growth system 310 that is similar to the system of FIG. 8 except that the carbon containing gas-permeable medium has been removed so that the Al and Si vapor species are provided by vaporizing the liquid melt while the N and C vapor species are provided by C and N containing source gas(es), in this case CN carried by $N_2$ as produced utilizing paracyanogen as described above.

Figure 10:
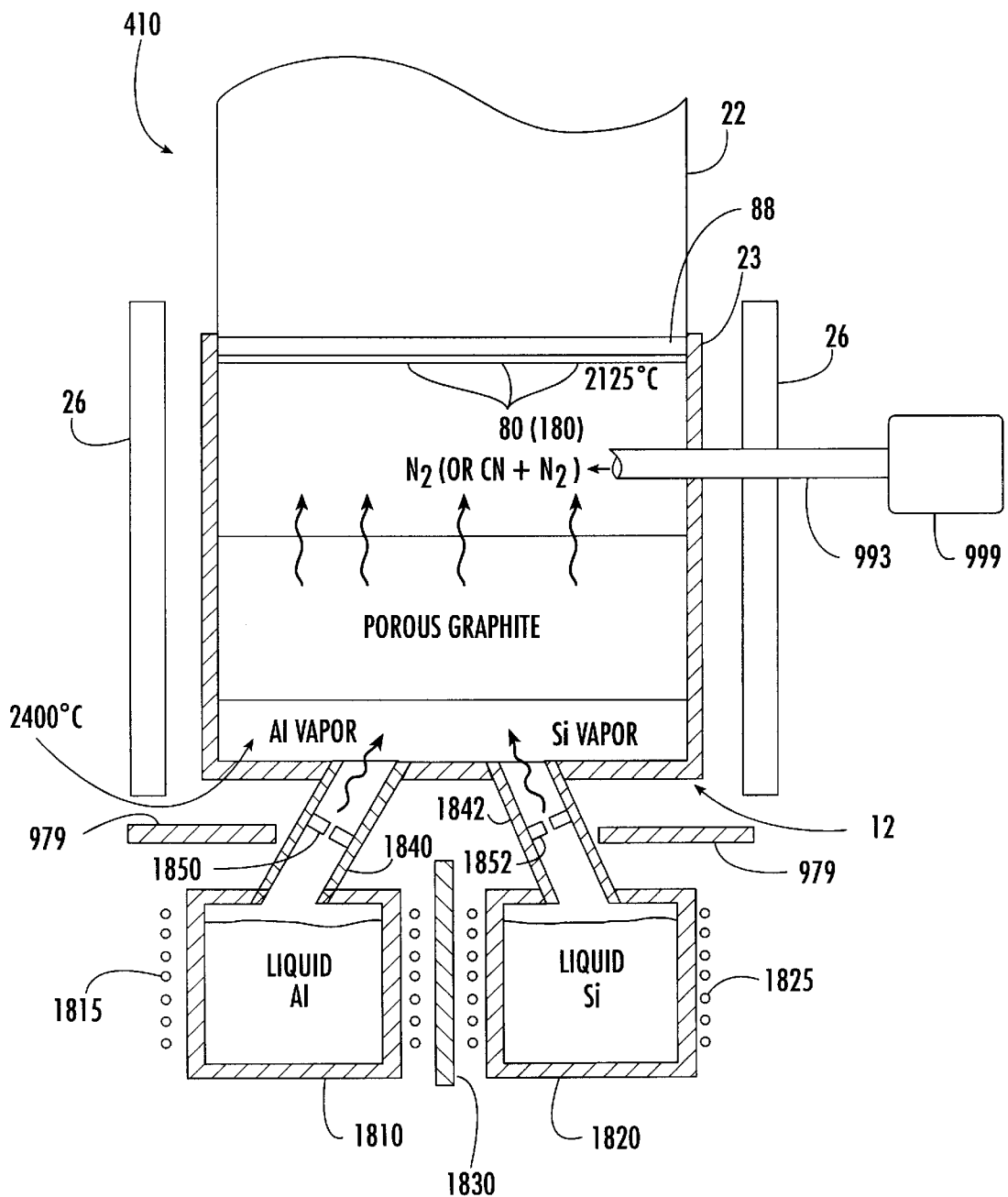
FIG. 10 is a schematic representation of portions of another alternative system for growing bulk single crystals of AlN:SiC alloy wherein Al and Si source vapor species emanate from individual separately controlled liquid melts of Al and Si respectively.

FIG. 10 illustrates a crystal growth apparatus 410 that is similar to the system shown in FIG. 8, but with separately contained molten liquid sources of Al and Si source vapors. More particularly, apparatus 410 includes a first crucible 1810 that holds liquid Al at a temperature controlled by a water-cooled induction heating coil 1815 and a second crucible 1820 that holds liquid Si at a temperature controlled by heating coil 1825. A thermal and electrical insulator 1830 separates crucibles 1810 and 1820. Crucibles 1810 and 1820 communicate with the growth crucible by respective Al/Si vapor flow conduits 1840, 1842 which preferably include baffles 1850, 1852 with central openings for creating a pressure gradient and facilitating vapor flow in the manner described above in connection with the embodiment of FIG. 8. The independent crucibles for producing Al and Si vapors are advantageous because the vapor pressure of Al is considerably higher than that of Si. Thus, when Al and Si are contained in liquid form in a common crucible, as in the embodiment of FIG. 8, the percentage composition of the Al—Si liquid must be controlled to produce the proper ratio of Al and Si vapors under the common temperature and pressure conditions in the crucible. Stated differently, a combined molten solution of Al—Si would typically require a high (atomic weight) percentage of Si therein to obtain the desired Al and Si vapor composition in the growth crucible. On the other hand, the separate crucibles of FIG. 10 permit independent temperature control for better control of vaporization rates of the Al and Si.

Figure 11:
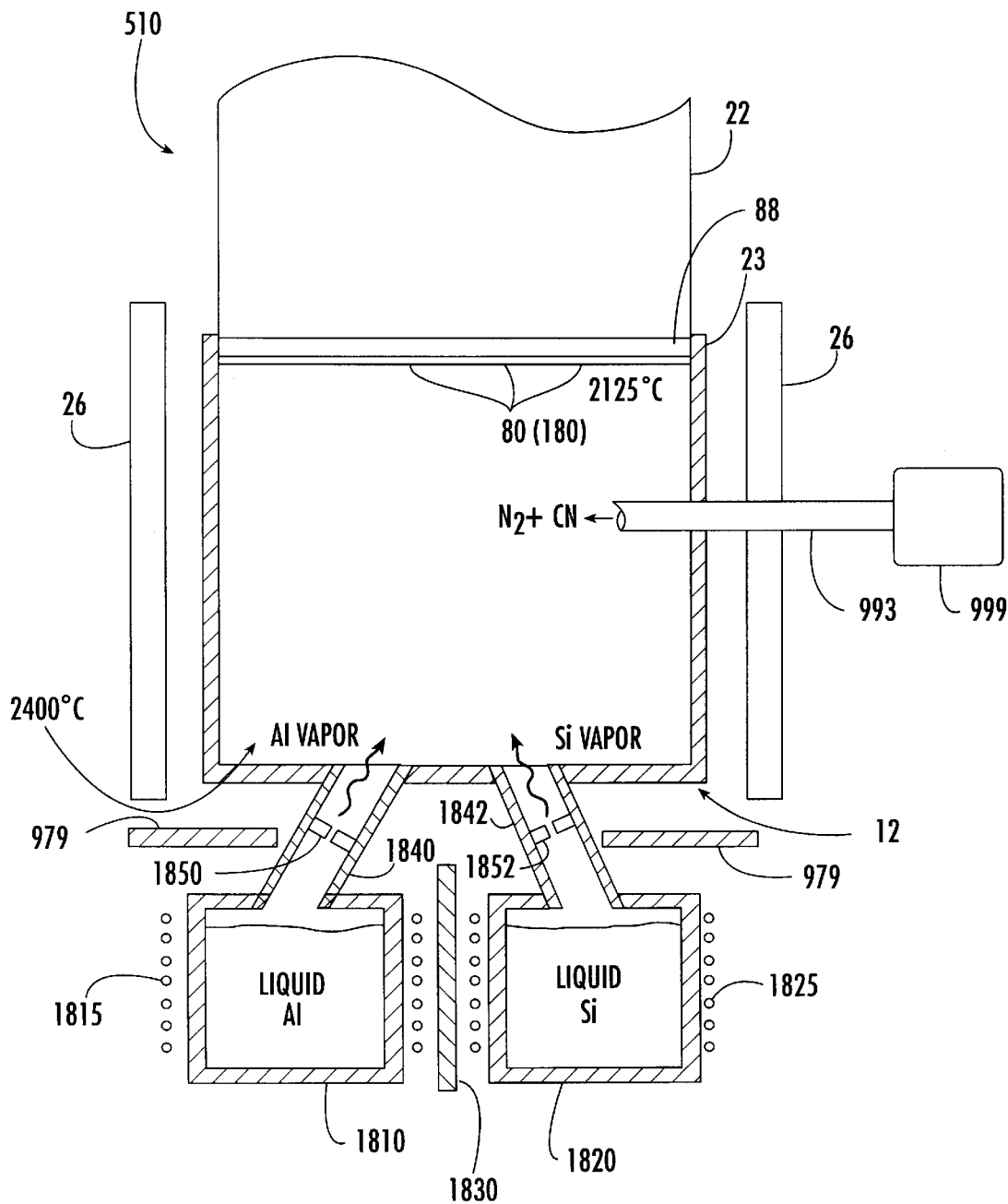
FIG. 11 shows a system similar to the system of FIG. 10 but with the porous graphite medium removed and the carbon vapor species being provided by injected CN gas.

FIG. 11 shows another crystal growth system 510 that is similar to the system of FIG. 10 except that the carbon containing gas-permeable medium has been removed so that the Al and Si vapor species are provided by vaporizing the liquid melt while the N and C vapor species are provided by C and N containing source gas(es), in this case CN carried by $N_2$ as produced utilizing paracyanogen as described above.

Figure 12:
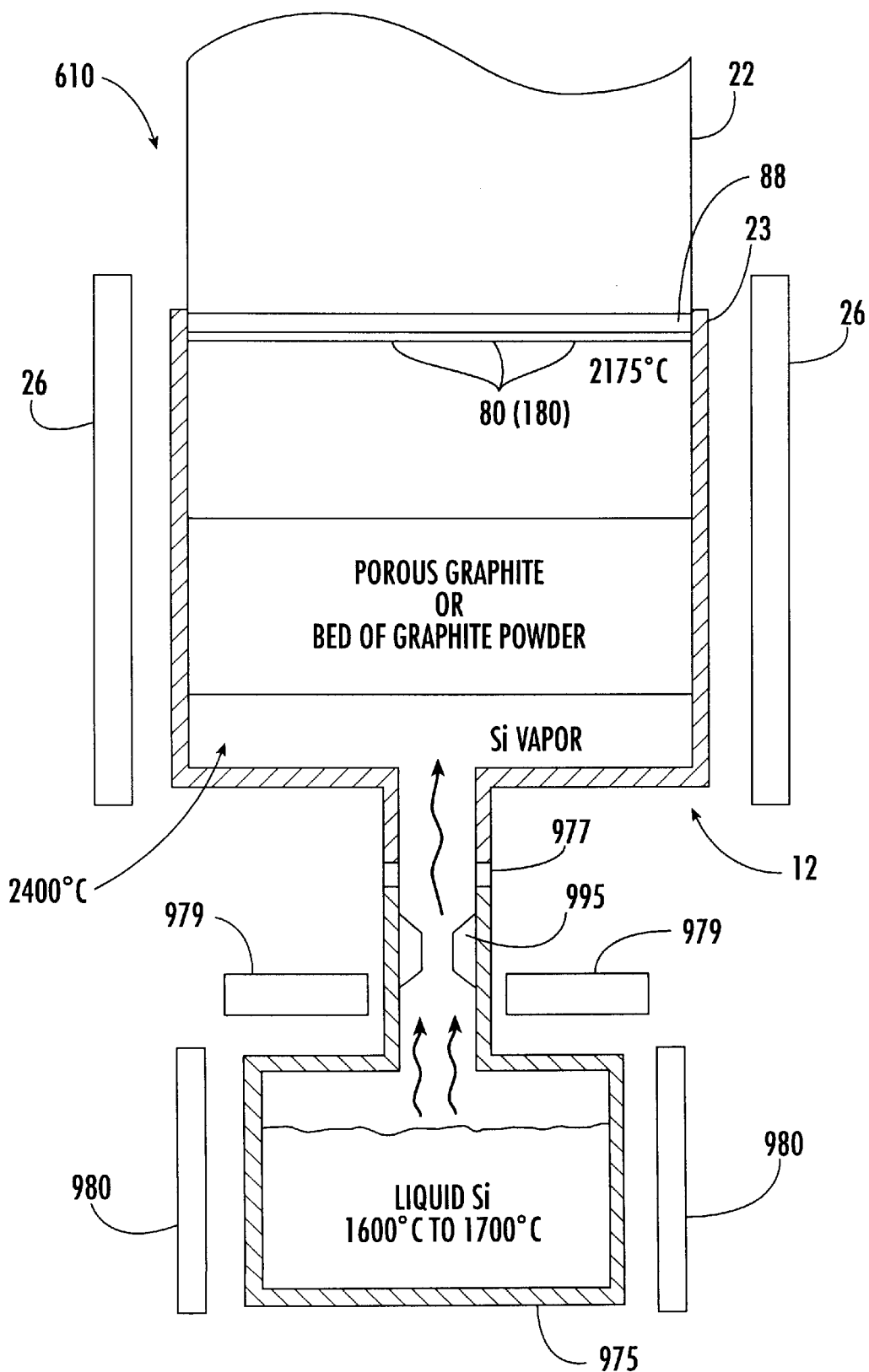
FIG. 12 shows a system for growing bulk single crystals of very pure SiC, for example intrinsic SiC, wherein the Si source vapor species emanate from a liquid Si melt and the Si vapors pass through a porous graphite medium or bed of graphite powder as the source of C vapor species.

FIG. 12 shows a system 610 for growing bulk single crystals of very pure SiC, for example intrinsic SiC, wherein the Si source vapor species emanate from a liquid Si melt and the Si vapors pass through a porous graphite medium or bed of graphite powder as the source of C vapor species. According to this embodiment, the temperature of the liquid Si may be maintained in the range from about 1600° C. to 1700° C. to produce the necessary Si vapors which, in turn, pass through a C containing gas permeable medium such as porous graphite or a bed of graphite powder of relatively large grain size, e.g., approximately 3 mm to 5 mm diameter. The crystal growth enclosure provided by furnace 12 has a maximum temperature at the bottom thereof on the order of 2400° C. The preferentially cooled nucleation sites, either unseeded sites 80 or seeded nucleation sites 180, are maintained in the range of about 2050° C. to 2322° C., with a temperature on the order of 2175° C. being preferred. With respect to furnace and nucleation site temperatures, a thermal gradient from the bottom of the furnace enclosure to the nucleation sites in the range of 5° C./cm to 20° C./cm is desirable, with a thermal gradient in the range of about 10 to 15° C./cm being preferred. For a furnace crucible having an inside diameter of 45 cm and a height of 15 cm (height-to-diameter aspect ratio=1:3), the thermal gradient is approximately 15° C./cm. In this regard, an aspect ratio of about 1:1 to 1:3 is generally preferred. Operation of system 610 as described above is particularly well suited to the production of pure bulk single crystals of SiC that may be grown in large quantities at low cost for various uses, especially as the synthetic material from which SiC gemstones may be fashioned in accordance with the principles of U.S. Pat. No. 5,723,391, the contents of which are incorporated herein by reference in entirety. More particularly, the availability of ultrapure bulk Si material and ultrapure graphite powder make it possible to produce very pure SiC crystals, for example 6 H SiC crystals, that, in intrinsic form, are colorless to the degree necessary to serve as simulated diamonds. According to the convention adopted above, the SiC bulk single crystals may be expressed as $AlN_x:SiC_y$ bulk single crystals where $x+y=1$, $x=0$ and $y=1$.

Figure 13:
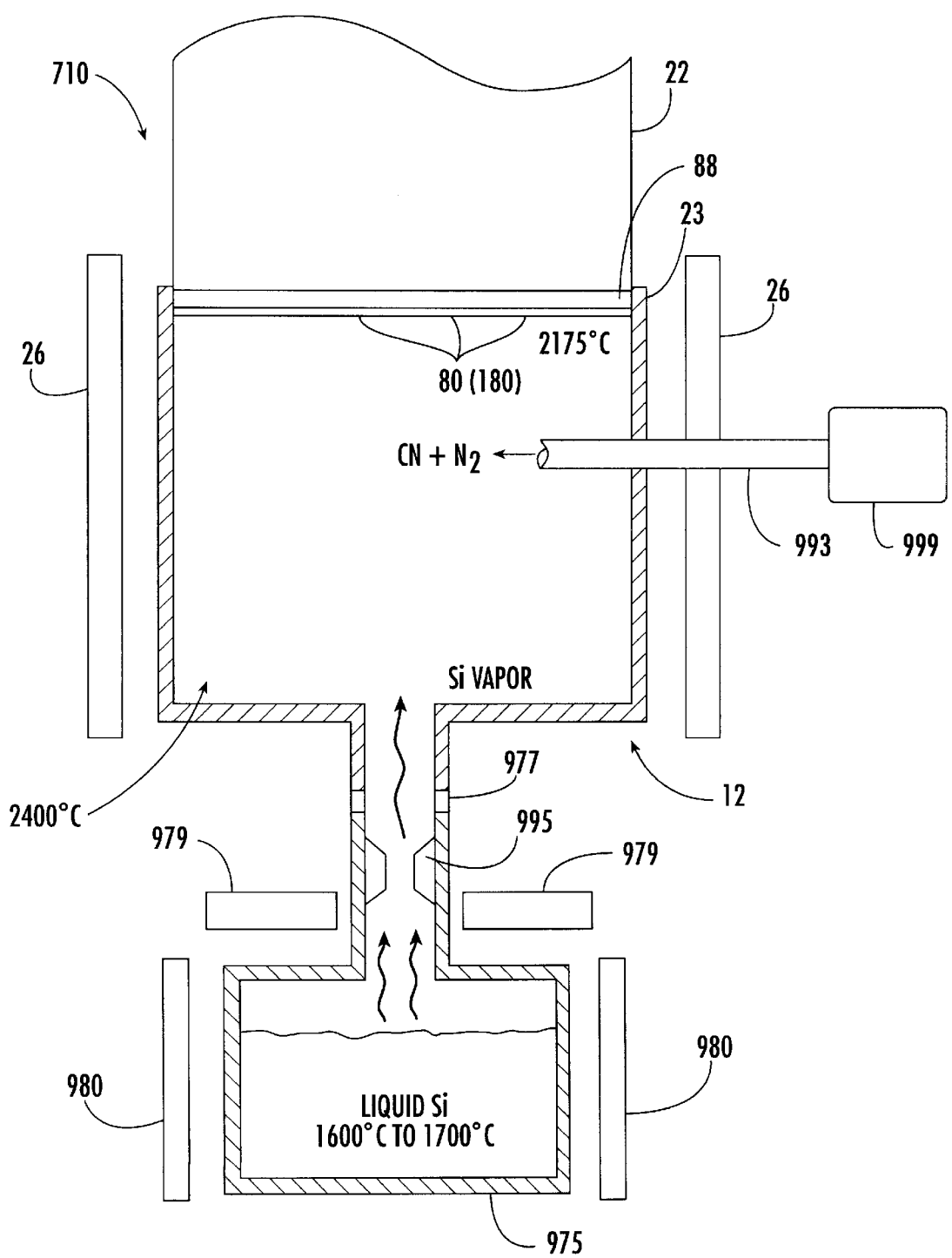
FIG. 13 shows a system similar to the system of FIG. 12 but with the porous graphite/graphite powder medium removed and the carbon vapor species being provided by injected CN gas.

FIG. 13 shows a crystal growth system 710 for growing bulk single crystals of SiC. System 710 is similar to the system of FIG. 12 with the exceptions that the porous graphite/graphite bed has been removed and injector 993 has been added to provide a source gas, particularly CN in an $N_2$ carrier gas. System 710 is operated at process parameters similar to those of system 610 of FIG. 12 to produce n-type SiC.

It will be appreciated that the systems of FIGS. 8–13 permit the use of very pure source vapors and the ability to carefully control the stoichiometry. These factors, coupled with the placement of the nucleation sites (either unseeded or seeded) near the molten liquid vapor sources, makes possible the operation of a system with little or no effusion, with it being understood that effusion is preferred.

It will also be appreciated with respect to the embodiments of FIGS. 8–13 that under certain pressure and temperature conditions the Si and Al, either combined or separately contained, may be vaporized from the solid form, instead of liquid.

The description will now turn to a discussion of another form of preferentially cooled multiple nucleations sites. FIGS. 14A and 14B schematically show top and side views respectively of a disc member 223 that forms a crucible upper surface in the same manner as disc members 23 and 123 served in connection with the embodiments of FIGS. 1–5. FIGS. 14A and 14B show the situation at time t=0 in the crystal growth cycle, while FIGS. 15A, 15B through 19A, 19B show the crystal growth sequence at other times through the end of a 20 hour growth cycle. Disc member 223 is divided into five concentric ring cooling zones 1–5. Above each cooling zone is a respective heat removal system (not shown) that removes heat from that zone. The heat removal systems are separately operated to preferentially cool the respective underlying portions of disc member 223. In operation, at t=0 (FIGS. 14A and 14B) zone 1 is activated to cool the center of disc member 223 and to create a preferentially cooled nucleation site thereunder. At t=1 hour (FIG. 15A and FIG. 15B) zone 2 is activated along with zone 1. By this time, nucleation of single crystalline $AlN_x:SiC_y$ has begun at the center of disc member 223 in zone 1. At t=2 hour (FIGS. 16A and 16B) zone 3 is activated in addition to zones 1 and 2. At this time, the crystal has grown radially outwardly in a rapid manner, preferably in the direction of the basal plane of the crystal. At t=3 hours (FIGS. 17A and 17B) zone 4 is activated along with zones 1–3. By this time the crystal has grown well into zone 3. At t=4 hours (FIGS. 18A and 18B) zone 5 is activated so that the entire disc member 223 may be cooled from that time until the end of the growth cycle. At t=20 hours (FIGS. 19A and 19B) the growth cycle is terminated and the crystal has grown to a desired thickness on the order of 20–50 mm. It will be appreciated that in accordance with the present invention, the system described in FIGS. 14–19 describes sequential preferential cooling of nucleation sites as the growth of single crystalline $AlN_x:SiC_y$ progresses. While not illustrated, the heat removal system above each zone 1–5 may comprise separate, computer controlled concentric cooling water circulation zones contained within a heat sink rod. Also, the lower surface of disc member 223 may include structural formations that encourage localized cooling, e.g. structure similar to sites 80 shown in FIG. 4. When such structure is incorporated into the embodiment of FIGS. 14–19, the system includes both sequential, localized heat removal and structural formations encouraging localized cooling.

The single crystals produced by this invention may be cut and polished for electronic applications. They also may be faceted and polished for use as synthetic gemstones, or used for other purposes as desired. With respect to electronics applications, the crystals may be grown with appropriate dopants to achieve desired p or n-type materials.

The growth of the bulk single crystals has been described sometimes herein as being accomplished by what is commonly referred to as a "sublimation" technique wherein the source vapor is produced at least in part when crystalline solids of Al, Si, AlN, SiC or other solids containing AlN, Al, N, SiC, Si or C sublime preferentially and thereafter recondense on the growing crystal interface. In other instances the source vapors, particularly Al and/or Si, are produced by vaporizing Al and/or Si liquids. Furthermore, according to the invention, the source vapor may be achieved in whole or in part by the injection of source gases or like techniques. In describing these and other techniques that are used to grow bulk single crystals according to this invention, the terms "depositing", "depositing vapor species" and like terms will sometimes be used.

It will be appreciated that according to the invention the crystals are typically produced on a batch basis. Following each run and cool-down period, the furnace is opened and the crystals are removed from the nucleation sites.

While the present invention has been described in connection with certain illustrated embodiments, it will be appreciated that modifications may be made without departing from the true spirit and scope of the invention.

That which is claimed:

1. A method of producing bulk single crystals of $AlN_x:SiC_y$ where $x+y=1$ and x is $1\rightarrow0$ and y is $0\rightarrow1$, comprising the steps of:

providing in a crystal growth enclosure vapor species of selected elements Al, Si, N and C necessary to grow bulk single crystals;

providing multiple nucleation sites in the crystal growth enclosure;

preferentially cooling the nucleation sites to a temperature less than surrounding surfaces in the crystal growth enclosure; and depositing the vapor species under conditions dictating the growth of single crystalline $AlN_x:SiC_y$ originating at the respective nucleation sites.

2. The method of claim 1 wherein the nucleation sites are unseeded.

3. The method of claim 1 wherein the nucleation sites are seeded.

4. The method of claim 1 including the step of depositing vapor species for a time period and under conditions dictating the growth of discrete crystals at the nucleation sites.

5. The method of claim 1 including the step of depositing vapor species for a time period and under conditions dictating the growth of a plate-like crystal comprising co-joined crystal portions emanating from multiple nucleation sites.

6. The method of claim 1 wherein x=0 and y=1.

7. The method of claim 1 wherein x=1 and y=0.

8. The method of claim 1 including the step of sequentially preferentially cooling nucleation sites as the growth of single crystalline $AlN_x:SiC_y$ progresses.

9. The method of claim 1 wherein the step of providing vapor species comprises subliming solid source material.

10. The method of claim 9 including the step of containing the solid source material in a containment structure having multiple upstanding porous tubular members through which sublimed vapors diffuse to reach the nucleation sites.

11. The method of claim 9 comprising heating the solid source material by a flat plate heater.

12. The method of claim 9 wherein the solid source material is selected from the group consisting of Al crystals, Si crystals, AlN:SiC crystals, sintered AlN:SiC, hydrostatically pressed AlN:SiC, hydrostatically pressed and sintered AlN:SiC and AlN:SiC powder.

13. The method of claim 1 wherein the step of providing vapor species comprises vaporizing Al and/or Si.

14. The method of claim 1 wherein the step of providing vapor species comprises injecting a source gas.

15. The method of claim 14 wherein the source gas is selected from the group consisting of $C_2N_2$, CN, vaporized paracyanogen, vaporized tetracyanoethylene, vaporized hexacyanobutadiene, vaporized Si, $SiH_4$, $AlCl_3$, $NH_3$, vaporized Al, $N_2$, atomic nitrogen, nitrogen ions and $N_2$ in combination with nitrogen ions.

16. The method of claim 1 including the step of forming the nucleation sites on one side of a plate member and preferentially cooling the nucleation sites by contacting the opposite side of the plate member with discrete cooling elements positioned directly opposite the nucleation sites.

17. The method of claim 16 wherein the nucleation sites comprise areas of conically shaped removed material which are cooled by respective pegs located on the opposite side of the plate.

18. A system for producing bulk single crystals of $AlN_x:SiC_y$ where x+y=1 and x is 1→0 and y is 0→1, said system comprising:

a source of vapor species of selected elements Al, Si, N and C;

a crystal growth enclosure for containing the vapor species;

multiple nucleation sites in the crystal growth enclosure; and means for preferentially cooling the nucleation sites to a temperature less than the surrounding surfaces in the crystal growth enclosure.

19. The system of claim 18 wherein the means for preferentially cooling the nucleation sites serves to sequentially preferentially cool the sites as the growth of single crystalline $AlN_x:SiC_y$ progresses.

20. The system of claim 19 wherein the nucleation sites comprise concentric zones.

* * * * *